(12) United States Patent
Kishinevsky et al.

(10) Patent No.: US 7,657,862 B2
(45) Date of Patent: Feb. 2, 2010

(54) SYNCHRONOUS ELASTIC DESIGNS WITH EARLY EVALUATION

(75) Inventors: Michael Kishinevsky, Beaverton, OR (US); Jordi Cortadella, Gelida (ES)

(73) Assignee: Intel Corporation, Santa Clara, CA (US)

( * ) Notice: Subject to any disclaimer, the term of this patent is extended or adjusted under 35 U.S.C. 154(b) by 414 days.

(21) Appl. No.: 11/634,462

(22) Filed: Dec. 6, 2006

(65) Prior Publication Data

US 2008/0136445 A1 Jun. 12, 2008

(51) Int. Cl.
*G06F 17/50* (2006.01)
(52) U.S. Cl. ............................................. 716/18; 716/6
(58) Field of Classification Search ....................... None
See application file for complete search history.

(56) References Cited

U.S. PATENT DOCUMENTS 6,314,553 B1 * 11/2001 Stevens et al. ................ 716/18

OTHER PUBLICATIONS

Jacobson et al., "Synchronous Interlocked Pipelines," Proc. of the 8th Int'l Symposium on Asynchronous Circuits and Systems, 2002 IEEE, 10 pages.*
Krstic et al., "Synchronous Elastic Networks," Proc. of the Formal Methods in Computer Aided Design, 2006 IEEE, 9 pages.*
Ampalam, Manoj , et al., "Counterflow Pipelining: Architectural Support for Preemption in Asynchronous Systems using Anti-Tokens", ICCAD '06, San Jose, CA,(Nov. 5-9, 2006), 611-618.
Blunno, I. , et al., "Handshake protocols for de-synchronization", Proc. International Symposium on Advanced Research in Asynchronous Circuits and Systems, IEEE Computer Society Press,(Apr. 2004), 149-158.
Brej, C. F., et al., "Early Output Logic using Anti-Tokens", Proc. International Workshop on Logic Synthesis, (May 2003),pp. 302-309.
Carloni, L. P., et al., "Coping with latency in SoC design", IEEE Micro, Special Issue on Systems on Chip, 22(5), (Oct. 2002), 12 pages.
Carloni, L. , et al., "Theory of latency-insensitive design", IEEE Transactions on Computer-Aided Design, 20(9), (Sep. 2001),pp. 1059-1076.
Chelcea, Tiberiu , et al., "Robust interfaces for mixed-timing systems with application to latency-insensitive protocols", Proc. ACM/IEEE Design Automation Conference, (Jun. 2001), 12 pages.
Cortadella, C. , et al., "Self: Specification and design of synchronous elastic architectures for DSM systems", TAU 2006, (2006), 6 pages.
Hazari, G. T., et al., "A novel technique towards eliminating the global clock in VLSI circuits", Int. Conf. on VLSI Design, (Jan. 2004), 565-570.
Jacobson, Hans M., et al., "Synchronous interlocked pipelines", Proc. International Symposium on Advanced Research in Asynchronous Circuits and Systems, (Apr. 2002), pp. 3-12.

(Continued)

*Primary Examiner*—Leigh Marie Garbowski
(74) *Attorney, Agent, or Firm*—Lee & Hayes, PLLC

(57) ABSTRACT

Embodiments of early enabling synchronous elastic designs, devices and methods are presented herein.

28 Claims, 17 Drawing Sheets

OTHER PUBLICATIONS

Kishinevsky, M., et al., "Concurrent Hardware: The Theory and Practice of Self-Timed Design", Concurrent Hardware: The Theory and Practice of Self-Timed Design (Chapter 1), John Wiley & Sons,(1994), pp. 1-42.

Manohar, R., et al., "Slack elasticity in concurrent computing", Proc. 4th International Conference on the Mathematics of Program Construction (J. Jeuring, ed.), vol. 1422 of Lecture Notes in Computer Science, (1998), pp. 272-285.

Suhaib, S., et al., "Presentation and formal verification of a family of protocols for latency insensitive design", FERMAT Technical Report Feb. 2005, Virginia Tech,(2005), 23 pages.

Svensson, C., "Synchronous Latency Insensitive Design", Proc. International Symposium on Advanced Research in Asynchronous Circuits and Systems, (2004), 35 pages.

Varshavsky, V., et al., "GALA (globally asynchronous—locally arbitrary) design", Concurrency and Hardware Design, vol. 2549 of Lecture Notes in Computer Science, Springer-Verlag,(2002), pp. 61-107.

Jacobson, "Interlocked Synchronous Pipelines," PhD dissertation, University of Utah, May 2004, 130 pages.

\* cited by examiner

| State | Encoding | |
|---|---|---|
| | V | S |
| Idle (I) | 0 | 0 |
| Hold (H) | 0 | 1 |
| Transfer (T) | 1 | 0 |
| Retry (R) | 1 | 1 |

*Fig. 5*

| Channel State | Sub-states | | Encoding | | | | Condition using DC |
|---|---|---|---|---|---|---|---|
| | | | $V^+$ | $S^+$ | $V^-$ | $S^-$ | |
| Idle (I) | $I^+$ | $I^-$ | 0 | 0 | 0 | 0 | $\neg V^+ \wedge \neg S^+ \wedge \neg V^- \wedge \neg S^-$ |
| Hold$^+$ (H$^+$) | $H^+$ | $I^-$ | 0 | 1 | 0 | 0 | $\neg V^+ \wedge S^+ \wedge \phantom{V^-} \wedge \neg S^-$ |
| Hold$^-$ (H$^-$) | $I^+$ | $H^-$ | 0 | 0 | 0 | 1 | $\neg S^+ \wedge \neg V^- \wedge S^-$ |
| Hold$^{+-}$ (H$^{+-}$) | $H^+$ | $H^-$ | 0 | 1 | 0 | 1 | $\neg V^+ \wedge S^+ \wedge \phantom{V^-} \wedge S^-$ |
| Transfer$^+$ (T$^+$) | $T^+$ | $I^-$ | 1 | 0 | 0 | 0 | $V^+ \wedge \neg S^+ \wedge \neg V^-$ |
| Transfer$^-$ (T$^-$) | $I^+$ | $T^-$ | 0 | 0 | 1 | 0 | $\neg V^+ \wedge V^- \wedge \neg S^-$ |
| Kill (K) | $T^+$ | $T^-$ | 1 | 0 | 1 | 0 | $V^+ \wedge \neg S^+ \wedge V^-$ |
| Retry$^+$ (R$^+$) | $R^+$ | $I^-$ | 1 | 1 | 0 | 0 | $V^+ \wedge S^+$ |
| Retry$^-$ (R$^-$) | $I^+$ | $R^-$ | 0 | 0 | 1 | 1 | $V^- \wedge S^-$ |

*Fig. 6*

SYNCHRONOUS ELASTIC DESIGNS WITH EARLY EVALUATION

BACKGROUND

Many computing devices include integrated circuits that utilize a synchronous design model. Synchronous designs typically undergo time discretization during early stages of design. This may result in early design decisions being made based on fixed latencies of computation and communication. These early design decisions may prevent changes during later design stages and create difficulties in scaling the design to fit advanced technologies. This is due, in some instances, to disproportional scaling of wire delays with respect to computing device delays.

In nano-scale technologies, for example, calculating the number of cycles required to transmit an event from a sender to a receiver may not be solvable until the final layout has been generated. This often leads to a significant re-design after the first layout is done. It may also lead to re-pipelining after the design is scaled into an advanced technology. Iterating and re-pipelining, however, are reactive rather than pro-active solutions.

BRIEF DESCRIPTION OF THE DRAWINGS

FIG. 5 is a chart of possible states of sub-channels in an elastic channel in accordance with an embodiment.

FIG. 6 is a chart of possible states of an elastic channel in accordance with an embodiment.

DETAILED DESCRIPTION

In the discussion that follows, specific implementation examples and methods are provided. It is to be appreciated and understood that such implementation examples and exemplary methods are not to be used to limit application of the claimed subject matter to only these examples. Rather, changes and modifications can be made without departing from the spirit and scope of the claimed subject matter. For example, it is specifically noted that many of the examples below are illustrated for a single clock synchronous design. Nevertheless, the described and claimed subject matter may also be utilized in multiple clock synchronous systems or globally asynchronous locally synchronous systems (GALS).

Figure 1:
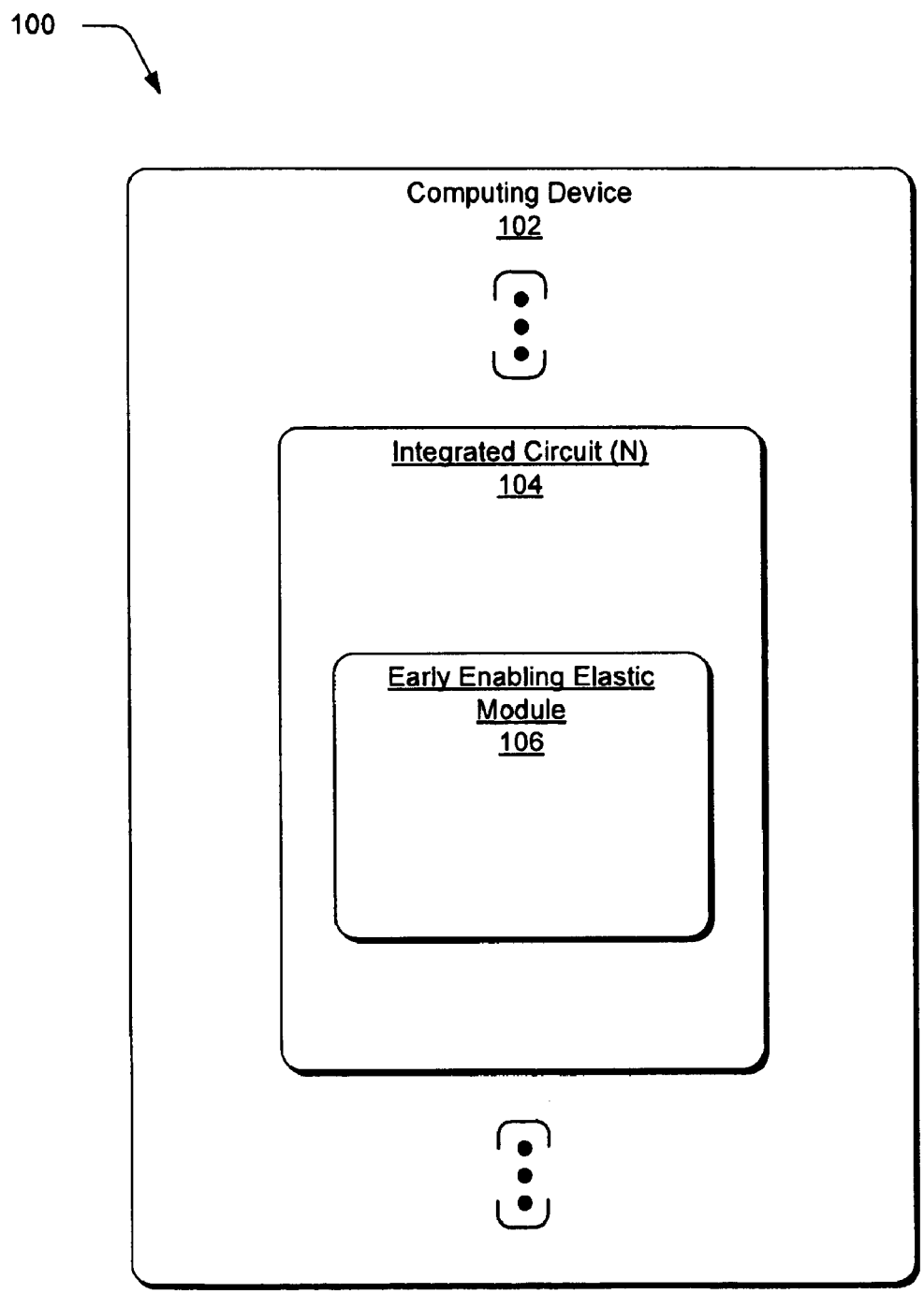
FIG. 1 depicts a computing device including an early enabling elastic module in accordance with an embodiment.

FIG. 1 depicts a system 100 comprising a computing device 102. Computing device 102 may include one or more integrated circuits, such as integrated circuit 104, one or more of which may include an early enabling elastic module 106. Early enabling elastic module 106 may utilize a protocol to implement in synchronous designs by using information about alternative branches of design behavior (or "choices"). It is noted that early enabling elastic module 106 may also be implemented in other designs, as may be the referenced protocol. Early enabling elastic module 106, through use of the referenced protocol, may allow for a design of an elastic (i.e. latency-tolerant) synchronous system that computes and communicates correctly under static and/or dynamic changes in latencies of computation blocks or communication channels. Early enabling elastic module 106 and/or the referenced protocol may also lead to increased performance and power trade-offs within integrated circuit 104, as described in detail below. This may be accomplished at least in part by taking into account a control flow of the system. Furthermore, the resulting system may be power, area, and delay efficient due to enablement of early activity propagation at a merge point and reduction of unnecessary activity before the merge point. Handling of precise interrupts and control hazards in the resulting elastic system may also be enabled, which is also described below.

Exemplary Synchronous Elastic Flow Protocol

Figure 2:
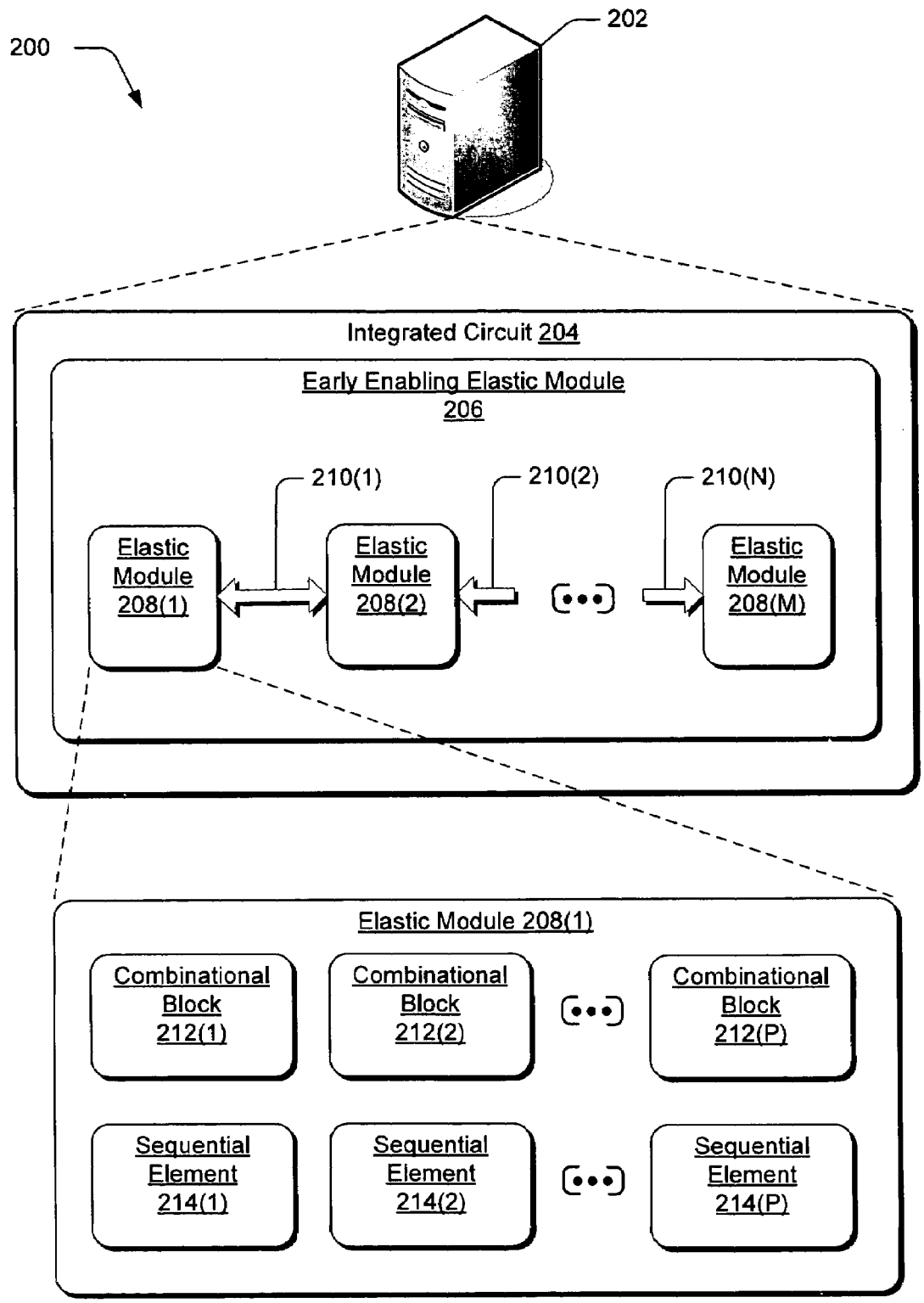
FIG. 2 depicts a computing device including an early enabling elastic module with elastic modules and elastic channels in accordance with an embodiment.

FIG. 2 depicts a system 200 that includes a computing device 202, which may include an integrated circuit 204 and an early enabling elastic module 206. In these implementations, early enabling elastic module 206 may comprise one or more elastic modules 208(1)-(M) and one or more elastic channels 210(1)-(N). Each elastic channel 210(1)-(N) may be capable of propagating data, information, or activity between one or more of the elastic modules 208(1)-(M). This collection of elastic modules 208(1)-(M) and elastic channels 210(1)-(N) may together define a synchronous elastic flow design.

Elastic channels 210(1)-(N) may follow a synchronous elastic flow protocol. In some implementations, this protocol may be encoded using channel control wires that implement a plurality of handshakes (e.g., two) between a channel's sender and a channel's receiver, each of which may comprise a block or module. Of course, in other implementations, other encoding(s) may be utilized. In the implementations described below, the exemplary encoding may use two symmetric sub-channels. Here, the sub-channels may comprise a positive sub-channel and a negative sub-channel.

Transfer of control information between a sender and a receiver may be performed with use of four control signals in some instances. Note that in some instances, a sender may also be termed a producer and a receiver may also be termed a consumer. Both may also comprise blocks or modules, which may be defined at various levels of granularity as discussed below. These control signals may travel Valid$^+$ ($V^+$) and Stop$^+$ ($S^+$) wires for the positive sub-channel, and Valid$^-$ ($V^-$) and Stop$^-$ ($S^-$) wires for the negative sub-channel. The $V^+/S^+$ pair may be used to propagate information in a forward direction. For valid data, this forward information may be termed "positive tokens" in some instances. For invalid data, this forward information may be termed "positive bubbles" in some instances. The transmission of valid data over a valid wire may inform the receiver that there is useful information that should not be ignored. In some implementations, valid data may comprise a 1, while a 0 may inform the receiver that there is no valid data to transmit.

Conversely, a stop wire may inform the sender as to whether or not the receiver is ready to receive data or information. In some implementations, a stop wire may comprise a 0 if a receiver is ready to receive data or a 1 if it is not. In some instances, if a stop wire indicates that a receiver is not ready to receive data (e.g., it transmits a 1), then it may inform neighboring senders in a distributed manner. First, the stop signal may send the signal to its immediate neighbor, which may accept the stop signal if the immediate neighbor is not currently transmitting valid information. If it is, then the stop signal may be propagated down the line to another sender.

Furthermore, the $V^-/S^-$ wire pair may be used to propagate backward information about "squash" requests. This backward information may be termed "negative tokens" in some instances. In some implementations, a flow of negative tokens may be used to squash positive tokens in a pipeline or channel, or in a block or module. This "squashing" may occur when the positive and negative tokens meet each other on the same channel, for instance. Furthermore, this "squashing" may happen when a positive token encounters a negative token in a block or module. These actions may in part allow a behavior of the protocol that may be termed "early enabling" or "early evaluation", which is discussed in detail below.

Furthermore, data or information that may be transmitted along a channel in the forward direction may be marked as Data$^+$. Data$^+$ may be transmitted along the positive sub-channel of the channel in some instances. Data or information may also be transmitted along a channel in a backward direction, opposite the forward direction in some instances. This backward direction may also be termed a "negative" direction. Data or information traveling along the channel in this manner may travel along the negative sub-channel, and may sometimes be marked or termed as Data$^-$. Data$^-$ may sometimes travel along the channel with "squash" requests, as described above. In some implementations, this may be used to carry the identification(s) of one or more instructions in order to selectively "squash" instructions of a particular type or the like. In some instances, Data$^-$ along with the "squash" requests may be used to implement a micro-architectural squash and play mechanism. In some exemplary channel protocols, the following two invariants may be satisfied by the channel protocol described above, as well as the surrounding environment:

Forward Invariant: Valid$^+$^Stop$^-$=False

Backward Invariant: Valid$^-$^Stop$^+$=False

States of the control wires may determine four possible states for each of the sub-channels. As depicted in FIG. 5, the four states may include "Idle" (I), "Hold" (H), "Transfer" (T), and "Retry" (R). In an idle sub-channel state, the sender may not provide valid data while the receiver may not request to retain the currently transmitted data. In an idle state, data transfer does not occur over the channel. A hold state, meanwhile, may indicate that the sender is not providing valid data, while the receiver is requesting to retain the currently transmitted information. Next, a transfer sub-channel state may indicate that the sender is transmitting valid data and the receiver is ready to accept. A transfer of the valid data over the channel may thus occur during this state. Additionally, a sub-channel may realize a retry state, which may indicate that the sender is providing data but the receiver is not able to accept it. In some instances, the channel may thus continue to persist in its attempt to transmit the data over the channel. In an implementation as described above, the channel protocol may allow for any state transition except for the following three: if a sub-channel is in a "Retry" state, then the next state may not be either "Idle" or "Hold"; if a sub-channel is in an "Idle" state, then the next state may not be "Hold".

FIG. 6 depicts nine possible symmetric states that may be reachable by a channel with the exemplary sub-channels described above. Other encodings can be used in different implementations, which may result in a channel capable of reaching states different than those shown in FIG. 6. As shown in FIG. 6, the exemplary channel may realize an Idle (I) state, where both the positive and negative sub-channels have idle states. In the Idle channel state, data is not transmitted along either the positive or the negative sub-channel. Another possible channel state is the Hold$^+$ (H$^+$) state, which may comprise a hold state in the positive sub-channel and an idle state in the negative sub-channel. Conversely, a channel may realize a Hold$^-$ (H$^-$) channel state, which may comprise a hold state in the negative sub-channel and an idle state in the positive sub-channel. Similarly, a Hold$^{+-}$ (H$^{+-}$) channel state may exist, wherein both the positive and negative sub-channels comprise hold states.

Meanwhile, if a channel realizes a Transfer$^+$ (T$^+$) state, data may transmit over the positive sub-channel. As shown in FIG. 6, such a state may exist when the positive sub-channel is in a transfer state while the negative sub-channel is in an idle state. Conversely, when these sub-channels states are reversed, a Transfer$^-$ (T$^-$) channel state may exist, which may cause data to transmit along the negative sub-channel in some implementations. A kill (i.e. squash) state may also be possible in the exemplary channel. In such a state, both the positive and negative sub-channels may be in a transfer state. Thus, in a kill (or squash) channel state information being transmitted along the positive sub-channel may be squashed by information and/or squash requests being transmitted along the negative sub-channel.

In some instances, a retry channel state may also be utilized. For example, if the positive sub-channel is in a retry state while the negative sub-channel is in an idle state, then the channel state may be Retry⁺ (R⁺). Conversely, the channel may have a state of Retry⁻ (R⁻) when these sub-channel states are reversed. When the exemplary channel has a state of either Retry⁺ or Retry⁻, the channel may continue to persist in its attempt to transmit information or data over the channel.

As mentioned above, the exemplary channel may achieve nine different states as listed in FIG. 6. In this example, both the sender and the receiver may maintain the same valid or squash request during retry cycles, and may thus satisfy a persistency condition. Exemplary persistency conditions may be as follows:

Forward Persistency: Valid⁺^Stop⁺=>next(Valid⁺)^(Next (Data⁺)=Data⁺)

Backward Persistency: Valid⁻^Stop⁻=>next(Valid⁻)^(Next (Data⁻)=Data⁻)

The above-described protocol and accompanying block structure may allow for early enabling of information in some implementations. Thus, in some instances, if a block has multiple inputted tokens of information, then early enabling may allow the block to produce an output token before each of the tokens have arrived. This may be true, for instance, if the relevant token(s) arrives at the block before each of the irrelevant tokens arrive. In some instances, the block will be aware of which token(s) is relevant and which is irrelevant. For instance, sometimes, a datapath will include a multiplexer, as discussed in detail below. The multiplexer may compute a condition, which essentially serves to select which of multiple tokens is relevant. The multiplexer may then communicate this choice to the block, which may then know which token(s) is relevant. Furthermore, the block may also thus know which token(s) to wait for before propagating an output token.

Furthermore, the above-described protocol and accompanying block structure may also allow for proper handling of irrelevant tokens. If, as described immediately above, a block learns that a certain token is relevant and the block produces an output token when the relevant token(s) arrives and before each of the irrelevant tokens arrive, then the block may also desire to ensure that the irrelevant tokens do not continue to flow through the design. Incorrect information may be produced, for instance, if irrelevant tokens are allowed to flow through the design.

The dual channel or dual control structure discussed above may extinguish this danger. Again, a block may include a positive channel to produce positive tokens and a negative channel to produce negative tokens comprising squash requests. The block may desire to remember which input channels comprise irrelevant tokens. In one implementation discussed above, the block may remember these input channels by producing a negative token comprising squash requests for each input channel that did not produce a relevant token. These negative tokens and squash requests may be configured to squash irrelevant tokens, so that the irrelevant tokens are not allowed to travel through the remaining design. This is described in detail above. It is noted that negative token generation is but one exemplary protocol and structure for handling irrelevant tokens, and other implementations are possible and are envisioned. Another implementation, for example, is discussed below in regards to FIG. 20 and the introduction of a real bit.

There are a variety of ways in which negative tokens may squash irrelevant information. The first may be termed a passive negative token mode. Here, one or more of the produced negative tokens may wait inside the block for the positive irrelevant tokens to arrive. Because the block remembers which input channels did not contribute a relevant token to output, the block and negative tokens may know that positive irrelevant tokens will arrive at certain input nodes of the block. At arrival, the positive and negative tokens may collide and squash each other. Thus, the positive irrelevant tokens are not allowed to flow downstream.

A second mode may be termed a proactive negative token mode. Here, one or more of the negative tokens produced may travel backward through the corresponding channel or pipeline in order to meet the one or more positive irrelevant tokens moving forward in the design. Sooner or later the positive and negative tokens will meet, at which point they may collide and squash each other.

As such, the dual control block may help to allow for early enabling of output tokens. Furthermore, such early enabling may increase performance of the system in some implementations. For instance, if the above-described protocol is implemented on an integrated circuit, this circuit's performance may be both faster and more powerful. Performance may be faster due to early enabling of output tokens. Furthermore, power may increase due to the squashing of irrelevant tokens at an early stage.

It is specifically noted that this protocol and/or structure may be used for a plurality of different communication or computation purposes. For instance, this elastic protocol and accompanying dual control block structure may be used to squash tokens other than irrelevant tokens. In specific examples, this protocol and structure may be used for exception handling. Here, negative tokens comprising squash requests may be used to squash tokens that may cause errors or exceptions in the system. Again, other uses are possible and are envisioned.

Exemplary Elastic Buffers

Reference is now made back to FIG. 2 and elastic modules 208(1)-(M). In some instances, one or more elastic modules 208(1)-(M) may compute one or more functions, possibly sequentially or combinationally. In some implementations, elastic modules 208(1)-(M) may be partitioned into combinational blocks 212(1)-(P) and sequential elements 214(1)-(P). One or more of combinational blocks 212(1)-(P) may perform computations, while one or more of sequential elements combinational blocks 212(1)-(P) may be configured to store and/or propagate some or all of the results of the performed computations.

Figure 3:
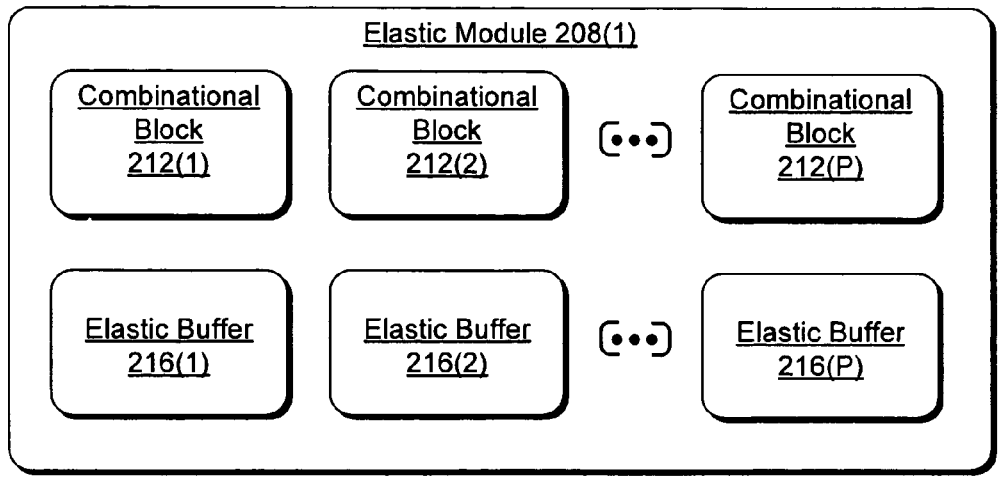
FIG. 3 depicts an elastic module including combinational blocks and elastic buffers in accordance with an embodiment.
Figure 4:
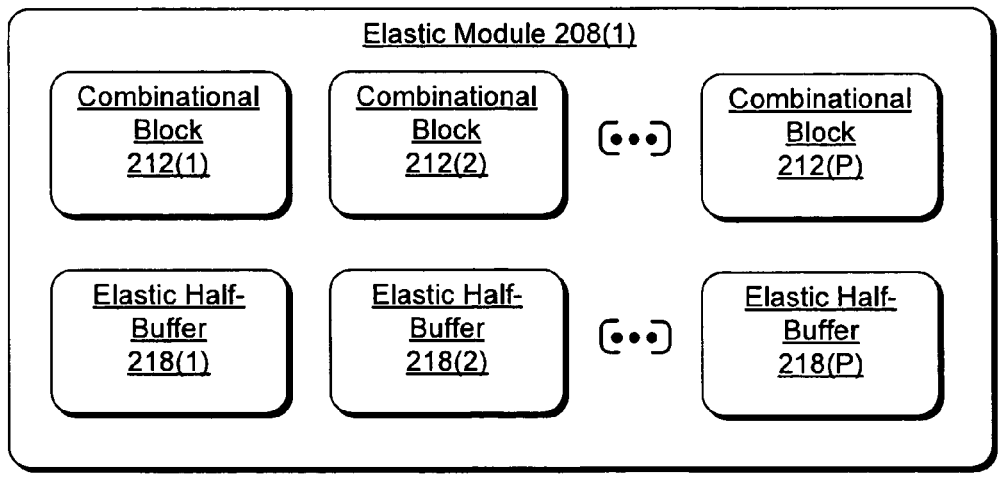
FIG. 4 depicts an elastic module including combinational blocks and elastic half-buffers in accordance with an embodiment.

As shown in FIG. 3, one or more of sequential elements 214(1)-(P) may correspond to one or more elastic buffers 216(1)-(P) in some instances. This may be true, for example, in flip-flop based circuits. In some instances, one or more of elastic modules 208(1)-(M) may comprise combinational blocks 212(1)-(P) and elastic buffers 216(1)-(P), as shown in FIG. 3. For circuits with transparent latches, meanwhile, one or more of sequential elements 214(1)-(P) may correspond to one or more elastic half-buffers 218(1)-(P). In some instances, one or more elastic modules 208(1)-(M) may comprise combinational blocks 212(1)-(P) and elastic half-buffers 218(1)-(P). FIG. 4 depicts this implementation. It is noted, however, that elastic buffers 216(1)-(P) and elastic half-buffers 218(1)-(P) may also be used interchangeably in some implementations. In some instances, sequentially composing two elastic half-buffers may result in an elastic buffer.

Functionally, elastic buffer 216(1) may serve to replace a regular register in a synchronous design. While a regular register may hold a single piece of information at a particular point in time, elastic buffer 216(1) may be capable of simultaneously storing or retaining two or more pieces of information created or sent at different times. Elastic buffer 216(1) may comprise a controller that may implement an elastic flow protocol. It may also comprise all or a portion of datapath 222.

Elastic buffer 216(1) may thus allow for a synchronous design to handle changes in latencies for linear computations or communications.

For instance, imagine that a synchronous design has been laid out before a realization is made that an additional clock cycle may be desirable to adequately communicate between two units in the design. In this instance, elastic buffer 216(1) may be inserted to provide this additional clock cycle without disrupting the flow of the remaining design. This is because elastic buffer 216(1) may be configured to retain a plurality of pieces of information, rather than merely a single piece. To provide for the extra clock cycle, elastic buffer 216(1) may initially contain a "bubble", or an invalid piece of information. Furthermore, the control layer may implement an elastic protocol, such as the one described above, and may thus be able to adequately handle elastic buffer 216(1) and the corresponding static latency change. This protocol may allow the control layer to differentiate valid tokens of information (i.e., valid information) from bubbles of information (i.e., invalid information). Thus, when the portion of the control layer that neighbors elastic buffer 216(1) receives a bubble of information, it may know to stop and wait for a valid token of information.

For example, a particular adder unit of a design may be intended to compute an addition of two valid tokens of information labeled A and B. In this example, a join could serve as a merge point for these two tokens of information. If an elastic buffer were to be inserted as discussed above, however, then these tokens of information may not arrive at the time planned during the initial design, again due to the elastic buffer's ability to create and handle extra cycle(s) for instance. In this example, the elastic buffer may have been inserted on a channel or pipeline upon which B is traveling, which may mean that A may be expected to reach the join before B. Due to the elastic properties of the control layer and its corresponding protocol, however, the join may stop A's progress and ask A to wait in a previous elastic buffer. Again, due to the elastic buffer's ability to hold multiple pieces of information, this may not impede other flows in the design. When B arrives (after it travels through the inserted elastic buffer), then A may likewise exit its elastic buffer and meet B at the join. The addition of A and B may then be latched in the next elastic buffer. As such, elastic buffers and an elastic control layer may allow for synchronous designs to handle changes in latencies.

Figure 7:
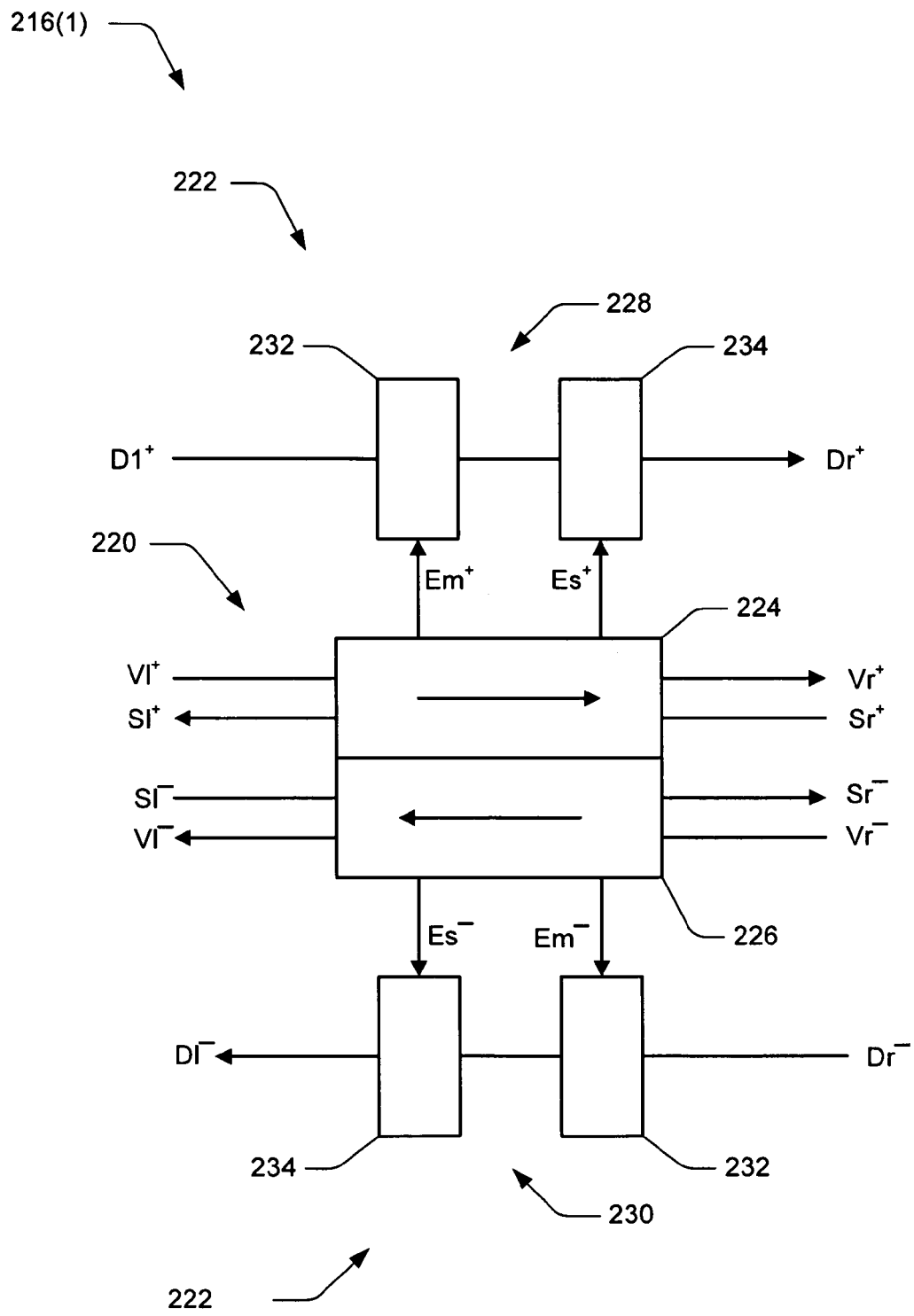
FIG. 7 depicts the structure of an elastic buffer in accordance with an embodiment.

FIG. 7 depicts a structure of an elastic buffer 216(1). As shown, elastic buffer 216(1) may comprise a control layer 220 and a datapath (or processing layer) 222. Control layer 220 may comprise, in some instances, a positive subsystem 224 and a negative subsystem 226, which may be symmetrical in some implementations. Positive subsystem 224 may include the input and output of Valid$^+$ and Stop$^+$ signals. Negative subsystem 226, meanwhile, may include the input and output of Valid$^-$ and Stop$^-$ signals. Datapath 222 may similarly comprise a positive subsystem 228 and a negative subsystem 230. Positive data may ingress and egress positive subsystem 228, and may do so in a forward direction. Negative data, meanwhile, may ingress and egress negative subsystem 230 and may do so in a backward direction. Datapath 222 may further comprise one or more latches.

For example, datapath 222 may comprise one or more master latches 232, as well as one or more slave latches 234. Enable signals, depicted in FIG. 7 as $E_m^+$, $E_s^+$, $E_m^-$, and $E_s^-$ may couple control layer 220 to datapath 222, and may also provide information to datapath 222. The $E_m^+$ enable signal may couple control layer positive subsystem 224 to master latch 232 of positive subsystem 228 of datapath 222. Also, the $E_s^+$ enable signal may couple control layer positive subsystem 224 to slave latch 234 of positive subsystem 228 of datapath 222. Similarly, the $E_m^-$ and $E_s^-$ signals may couple negative subsystem 226 of control layer 220 to negative subsystem 230 of datapath 222. This illustrated and described structure may allow information or data to be transmitted from control layer 220 to datapath 222. Furthermore, this exemplary structure may allow these two components to communicate with each other. If, however, a stop signal as described above is transmitted to elastic buffer 216(1), then some information may be kept within latches 232 and 234 rather than transmitted to datapath 222.

Figure 8:
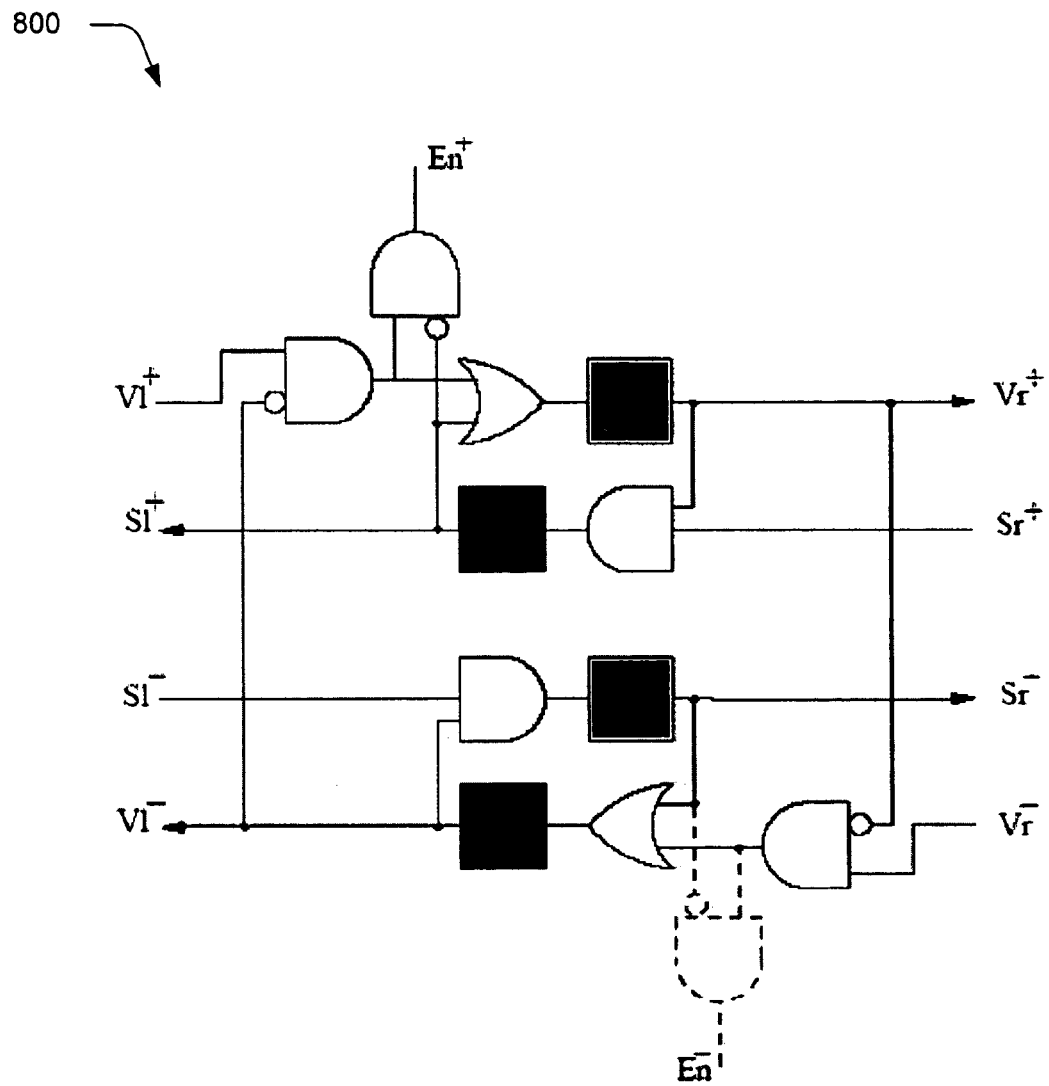
FIG. 8 depicts a design of an elastic half-buffer in accordance with an embodiment.

The structure of FIG. 7 may be accomplished with multiple different controller structures. FIG. 8 depicts but one non-limiting implementation of a structure 800 of an elastic-half buffer comprising latches, AND-gates, and OR-gates. In this implementation, the elastic half-buffer may be composed of two identical interacting sub-circuits implementing positive and negative subsystems. The structure may include transparent latches of differing polarity (e.g., active-high and active-low). In this implementation, an elastic buffer, such as that depicted in FIG. 7, may result by sequentially composing two elastic half-buffers as depicted in FIG. 8.

Figures 9, 10:
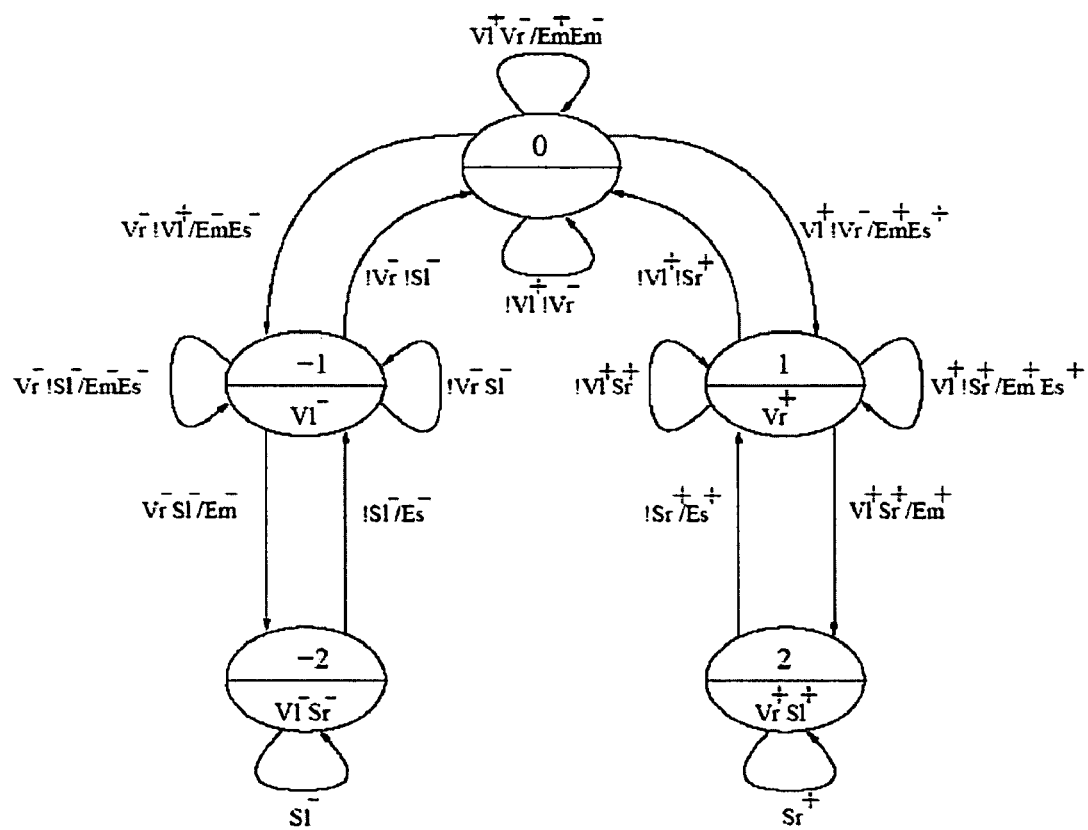
FIG. 9 depicts a state encoding of the elastic buffer of FIG. 7 in accordance with an embodiment.
FIG. 10 depicts a finite state machine (FSM) specification of the elastic buffer of FIG. 7 in accordance with an embodiment.

FIG. 9 depicts a state encoding of elastic buffer 216(1) depicted in FIG. 7. As shown, elastic buffer 216(1) may have a state of between −2 and +2. Furthermore, FIG. 10 depicts a finite state machine (FSM) specification of elastic buffer 216(1). It is noted that other state encodings or FSM specifications may exist for other non-illustrated embodiments of elastic buffers or elastic half-buffers.

Figure 11:
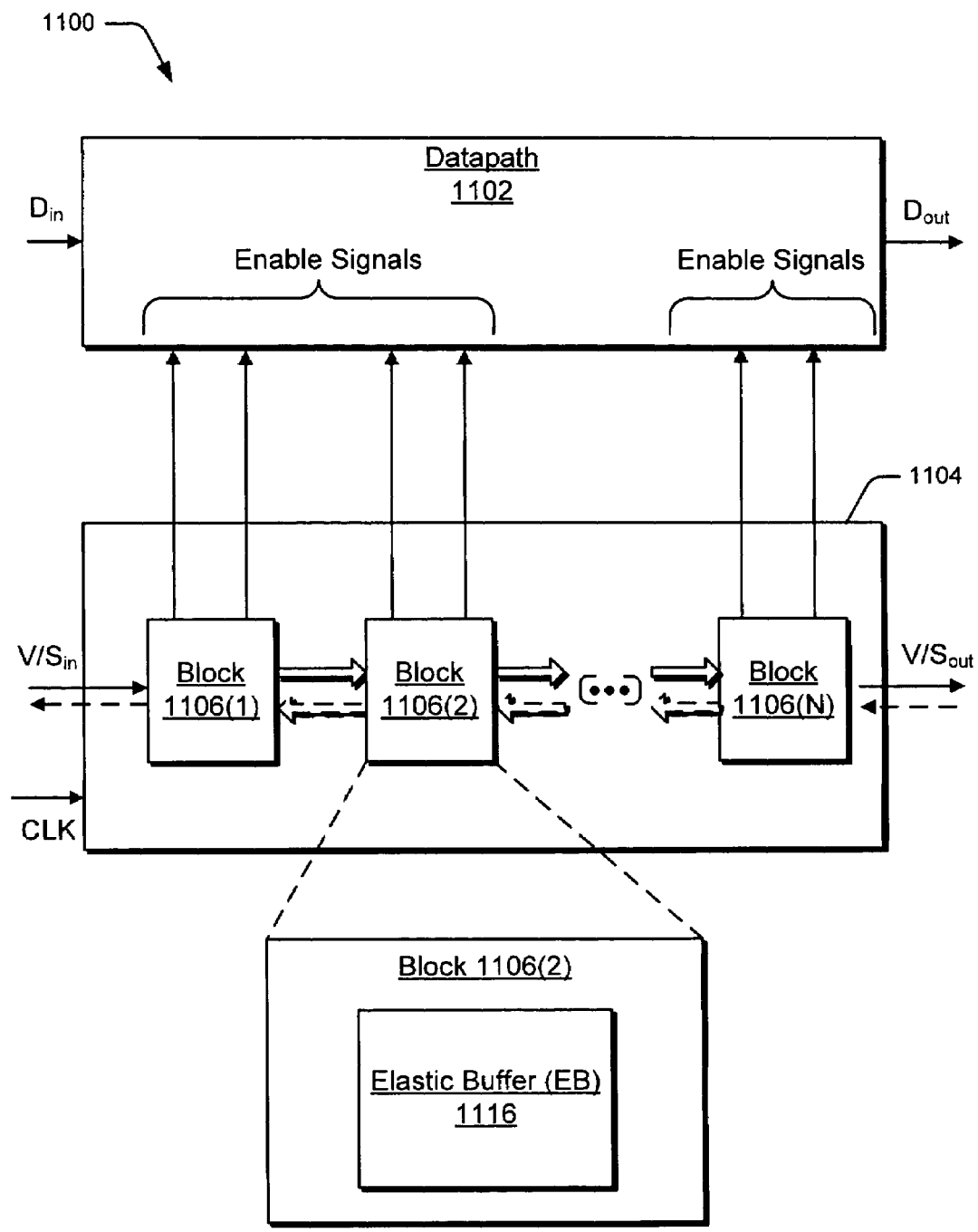
FIG. 11 depicts a netlist of a latency-tolerant design comprising a datapath and a control layer, the control layer including an elastic buffer, in accordance with an embodiment.

FIG. 11 depicts an exemplary netlist 1100 in which one or more elastic buffers may exist. Netlist 1100 may, in some instances, depict a logic design of early enabling elastic module(s) 106 and/or 206. As illustrated, netlist 1100 may comprise a datapath 1102 and a control layer 1104. Similar to the datapaths discussed above, datapath 1102 may function to transmit data. In the illustrated implementation, data inputting datapath 1102 is depicted as $D_{in}$, while outputting data is termed $D_{out}$, with both including corresponding arrows. Meanwhile, control layer 1104 may function to control such transmission of data. This is depicted by V/S$_{in}$ and V/S$_{out}$ (and their corresponding arrows). As discussed above, control layer 1104 may comprise both a positive subsystem and a negative subsystem. As such, V/S$_{in}$ and V/S$_{out}$ may comprise four sets of wires-two for each subsystem of differing polarities.

Control layer 1104 may further comprise a plurality of blocks 1106(1)-(N), each of which may be coupled in some manner, such as by elastic channels as discussed above. Blocks 1106(1)-(N) may comprise a plurality of controllers and the like, comprising a plurality of AND, OR, NAND, NOR and other logic gates. For instance, a block 1106(n) could include a join, merge, register, elastic buffer, latch, eager fork, lazy fork, and the like. It is specifically noted that blocks 1106(1)-(N) may be formed at different levels of granularity. As illustrated, block 1106(2) comprises elastic buffer 1116, which may comprise many or all of the properties associated with elastic buffer 216(1) above. Thus, netlist 1100 may result in an elastic system capable of handling changes in latencies.

Exemplary Variable Latency Controllers

Figure 12:
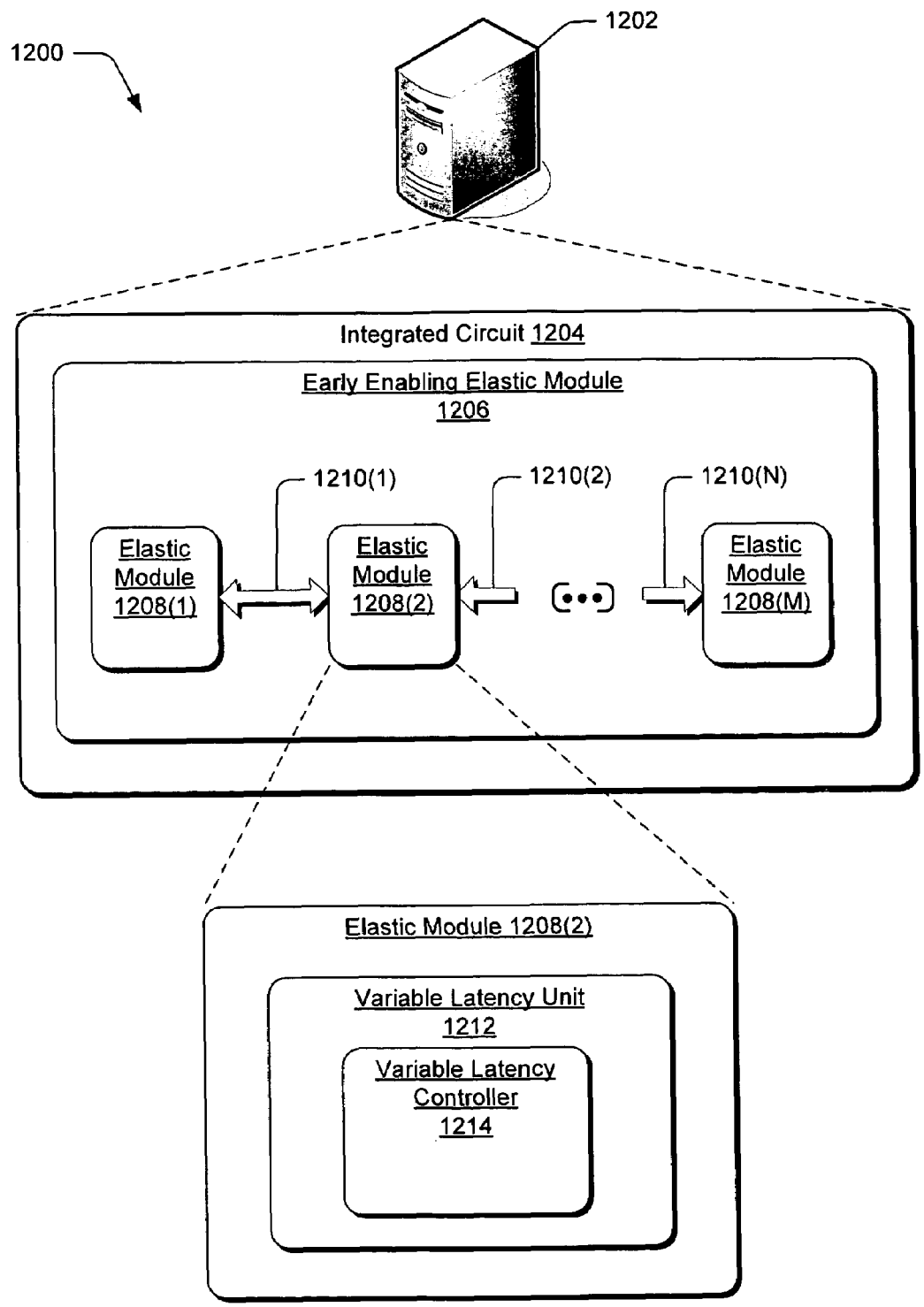
FIG. 12 depicts a computing device including an early enabling elastic module with a variable latency unit in accordance with an embodiment.

FIG. 12 depicts a system 1200 comprising a computing device 1202. Computing device 1202 may include one or more integrated circuits, such as integrated circuit 1204, one or more of which may include an early enabling elastic module 1206. Early enabling elastic module 1206 may comprise one or more elastic modules 1208(1)-(M) and one or more elastic channels 1210(1)-(N). Early enabling elastic module 1206 may implement a synchronous elastic protocol, as discussed in detail above.

In this instance, however, early enabling elastic module 1206 may comprise a variable latency unit 1212, which may comprise a variable latency controller 1214. Variable latency unit 1212 may comprise any type of computation or communication unit, with an adder or the like serving as but one basic example. As opposed to a traditional computation or communication unit that works on fixed clock cycles, variable latency unit 1212 may be configured to support operations performed at varying clock cycles. This may be due, at least in part, to variable latency controller 1214.

If variable latency unit 1212 comprises an adder to perform a simple addition of two numbers, for example, then variable latency unit 1212 may be configured to perform such additions at dynamically variable clock cycles. For small numbers, for example, variable latency unit 1212 configured as an adder may complete the additions of such numbers in a relatively short duration, such as one clock cycle for instance. If, however, larger numbers are inputted into the adder, then variable latency unit 1212 may complete the addition in a longer duration, such as three clock cycles for instance. As such, early enabling elastic module 1206 may be configured to handle dynamic changes in latencies in the system. The speed of variable latency unit 1212 may thus be, on average, shortened due to this ability to perform operations at varying clock cycles or durations. In some instances, this may result in faster speeds for integrated circuit 1204.

Figure 13:
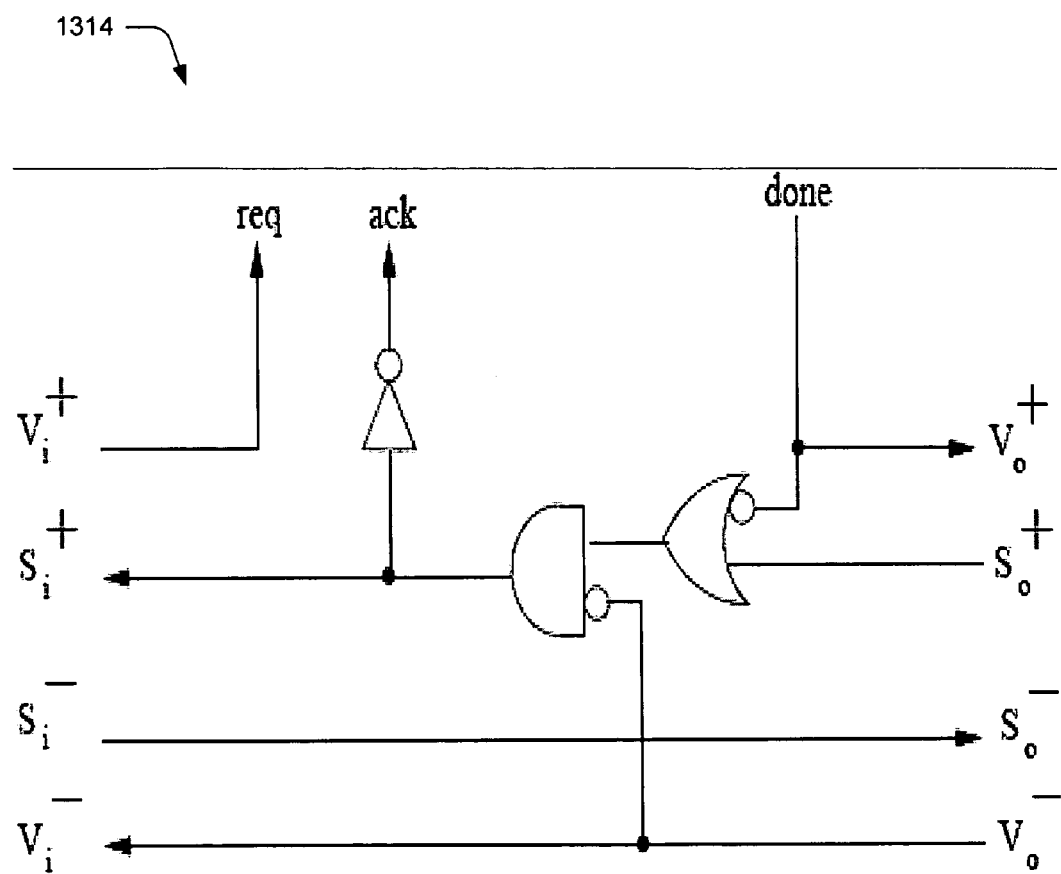
FIG. 13 depicts the design of a variable latency controller in accordance with an embodiment.

FIG. 13 depicts the structure an exemplary variable latency controller 1314. In some implementations, variable latency controller 1314 may be similar or identical to variable latency controller 1214. Furthermore, variable latency controller 1314 may implement a synchronous elastic protocol similar or identical to the protocol discussed above. As such, variable latency controller 1314 may comprise positive and negative subsystems as well as valid and stop wires, as discussed above. In addition, variable latency controller 1314 may include an interface to allow for communication between the variable latency controller in the control layer and the processing layer or datapath. As illustrated, in some implementations this interface may provide a request signal "req" to start computation, a completion signal "done", and an acknowledge signal "ack" to report to the processing layer that the elastic layer consumed the computed token. In some implementations, the variable latency controller interface may be coupled with the corresponding interfaces of the general controller(s). It is specifically noted that while FIG. 13 depicts a variable controller with a collection of logic gates, multiple other controllers may be possible and are envisioned. These other controllers may also implement the protocol discussed above, or a similar protocol.

Figure 14:
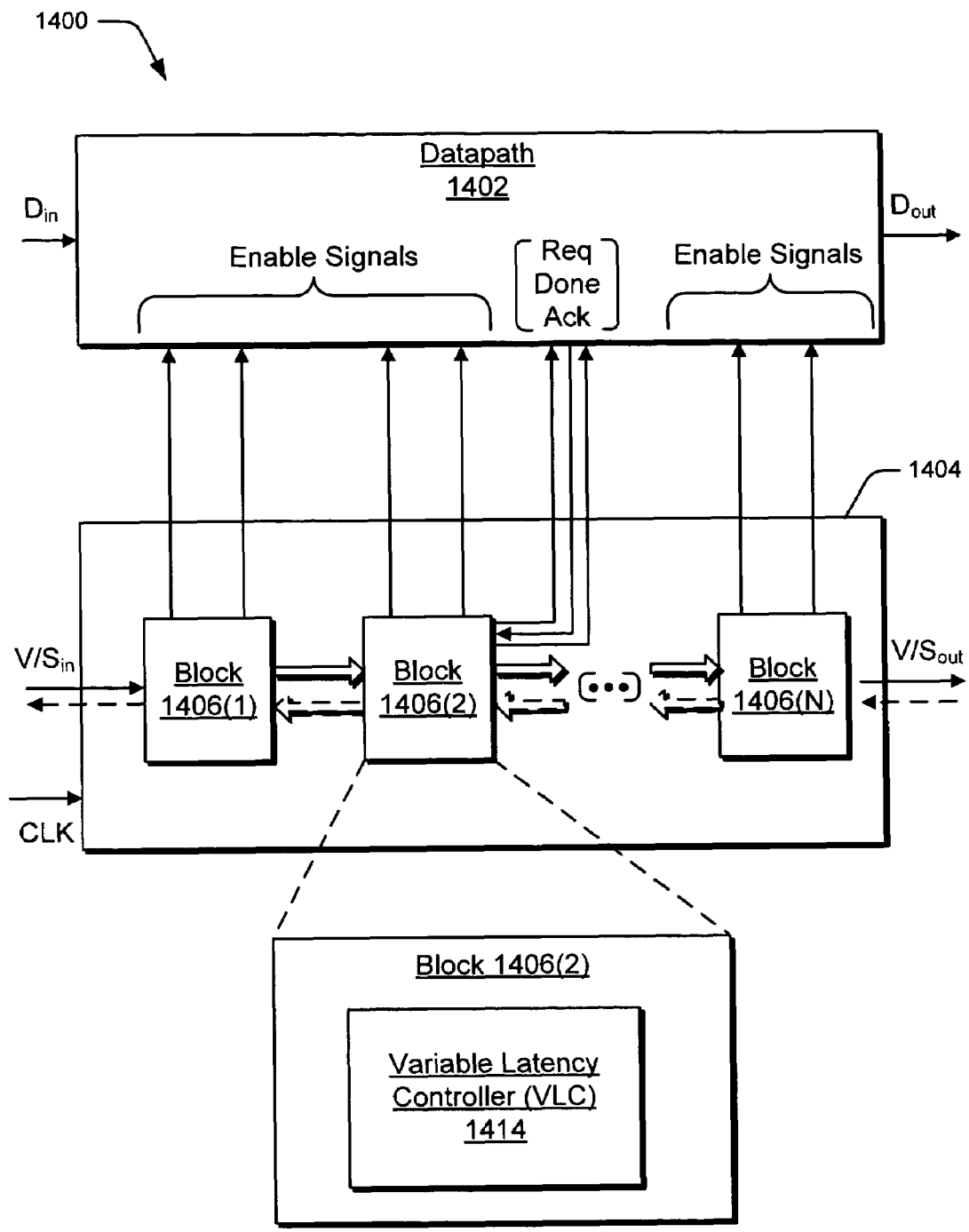
FIG. 14 depicts a netlist of an elastic design comprising a datapath and a control layer, the control layer including a variable latency controller, in accordance with an embodiment.

FIG. 14 depicts an exemplary netlist 1400 in which one or more variable latency controllers and variable latency units may exist. Netlist 1400 may, in some instances, depict a logic design of early enabling elastic module(s) 106 and/or 206. As illustrated, netlist 1400 may comprise a datapath 1402 and a control layer 1404. Similar to the datapaths discussed above, datapath 1402 may function to transmit data. In the illustrated implementation, data inputting datapath 1402 is depicted as $D_{in}$ while outputting data is termed $D_{out}$, with both including corresponding arrows. Meanwhile, control layer 1404 may function to control such transmission of data. This is depicted by $V/S_{in}$ and $V/S_{out}$ (and their corresponding arrows). As discussed above, control layer 14104 may comprise both a positive subsystem and a negative subsystem. As such, $V/S_{in}$ and $V/S_{out}$ may comprise four sets of wires-two for each subsystem of differing polarities.

Control layer 1404 may further comprise a plurality of blocks 1406(1)-(N), each of which may be coupled in some manner, such as by elastic channels as discussed above. Blocks 1406(1)-(N) may comprise a plurality of controllers and the like, with one or more comprising a plurality of AND, OR, NAND, NOR and other logic gates. For instance, a block 1406(n) could include a join, merge, register, elastic buffer, latch, eager fork, lazy fork, and the like. It is specifically noted that blocks 1406(1)-(N) may be formed at any level of granularity.

As illustrated, block 1406(2) comprises variable latency controller 1414, which may comprise many or all of the properties associated with variable latency controller 1214 and/or 1314 discussed above. Thus, netlist 1400 may result in an elastic system capable of handling changes in latencies, and more specifically may be capable of handling variable or dynamic changes in latencies.

Figure 15:
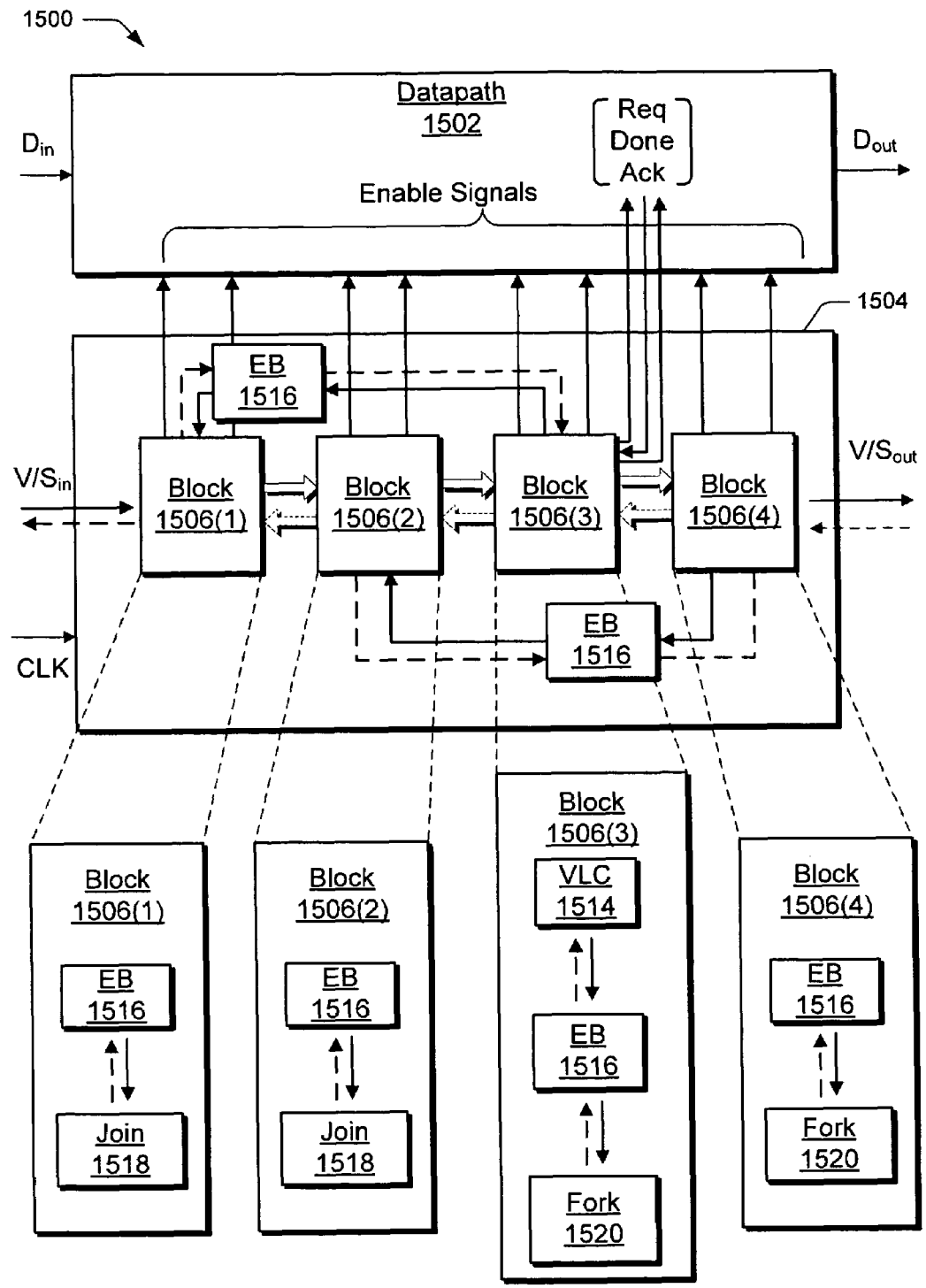
FIG. 15 depicts a netlist of an elastic design comprising a datapath and a control layer, the control layer including an elastic buffer, a variable latency controller, a join, and a fork, in accordance with an embodiment.

Exemplary Synchronous Elastic System Including Elastic Buffers and Variable Latency Units FIG. 15 depicts an exemplary netlist 1500 for a synchronous elastic system including elastic buffers and variable latency units and/or controllers. This system may be, in some implementations, a compilation of previously-defined components. The system may, in some instances, implement an elastic flow protocol as discussed above, or the like. Netlist 1500 may also include many of the same characteristics discussed above in regards to netlists 1100 and 1400. For instance, netlist 1500 may comprise datapath 1502 and control layer 1504, which may implement an elastic flow protocol.

In this instance, netlist 1500 may define an exemplary synchronous elastic system including both elastic buffers and variable latency units, both discussed above. Control layer 1504 of the exemplary system may comprise blocks 1506(1)-(4), which may be coupled by elastic channels in some implementations. Furthermore, one or more blocks in the system may be pipelined together. In the illustrated embodiment, blocks 1506(1) and 1506(3) are shown to be pipelined, as are blocks 1506(2) and 1506(4). These pipelines may introduce new delays. Thus, an elastic buffer (EB) 1516 may be inserted into the wire to compensate for these delays, as discussed above. Furthermore, other elastic buffers may be dispersed throughout the system to handle changes in latencies. As such, netlist 1500 may depict an elastic synchronous design capable of tolerating changes in latencies.

Furthermore, this system may comprise one or more variable latency controllers (VLC) 1514 and, hence, one or more variable latency units. Variable latency controller 1514 may comprise many of the same characteristics as described above in regards to variable latency controllers 1214, 1314, and 1414. As such, netlist 1500 may depict a system capable of handling variable or dynamic changes in latencies.

Furthermore, in some implementations, information can be received from different sources (e.g. producers) and can be sent to different sources (e.g. consumers). This may be accomplished with the use of a join 1518 and a fork 1520, respectively. As discussed in detail below, forks and joins may comprise a multitude of structures. For instance, a fork may comprise a lazy fork or an eager fork, while a join may comprise an early enabling join or a merge in some implementations.

In combination, netlist 1500 may thus in some implementations define an synchronous elastic flow system capable of directing multiple inputs and outputs, capable of handling both dynamic and static latency changes, and capable of allowing for early enabling of information by use of an elastic flow protocol.

Exemplary Elastic System Block

Figure 16:
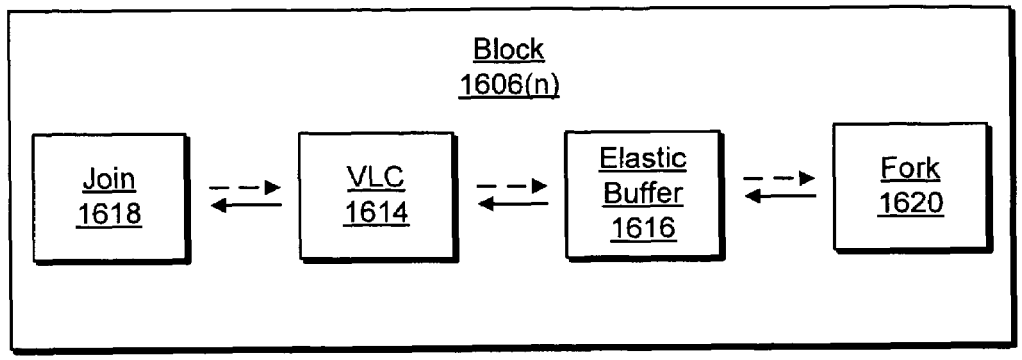
FIG. 16 depicts a block of an elastic design, including a join, a variable latency controller, an elastic buffer, and a fork, in accordance with an embodiment.

FIG. 16 depicts a portion of a netlist of a synchronous elastic flow system comprising a general block 1606(*n*). Block 1606(*n*) may comprise a join 1618, a variable latency controller (VLC) 1614, an elastic buffer 1616, and a fork 1620. Some or all of these components may implement an elastic flow protocol as discussed above, or a similar protocol.

Join 1618 may comprise an early enabling join or a merge, in some implementations. As such, join 1618 may be configured to receive a plurality of input tokens of information, but may not need to wait to receive all such tokens before outputting one or more output tokens. Variable latency controller 1614 may comprise many of the same characteristics as discussed above in regards to other variable latency controllers 1214, 1314, 1414, and/or 1514. Similarly, elastic buffer 1616 may comprise many of the same characteristics discussed above in regards to elastic buffers 216(1)-(P), 1116, and/or 1516. Furthermore, fork 1620 may comprise any number of suitable forks capable of receiving input from a single producer and sending output to multiple consumers. For example, fork 1620 may comprise a lazy fork or an eager fork. A lazy fork may wait for each of the consumers to become ready to receive information before sending information. An eager fork, meanwhile, may ensure that information such as a positive token will be sent to a ready consumer without waiting for other receiving consumers to become ready.

Figure 17:
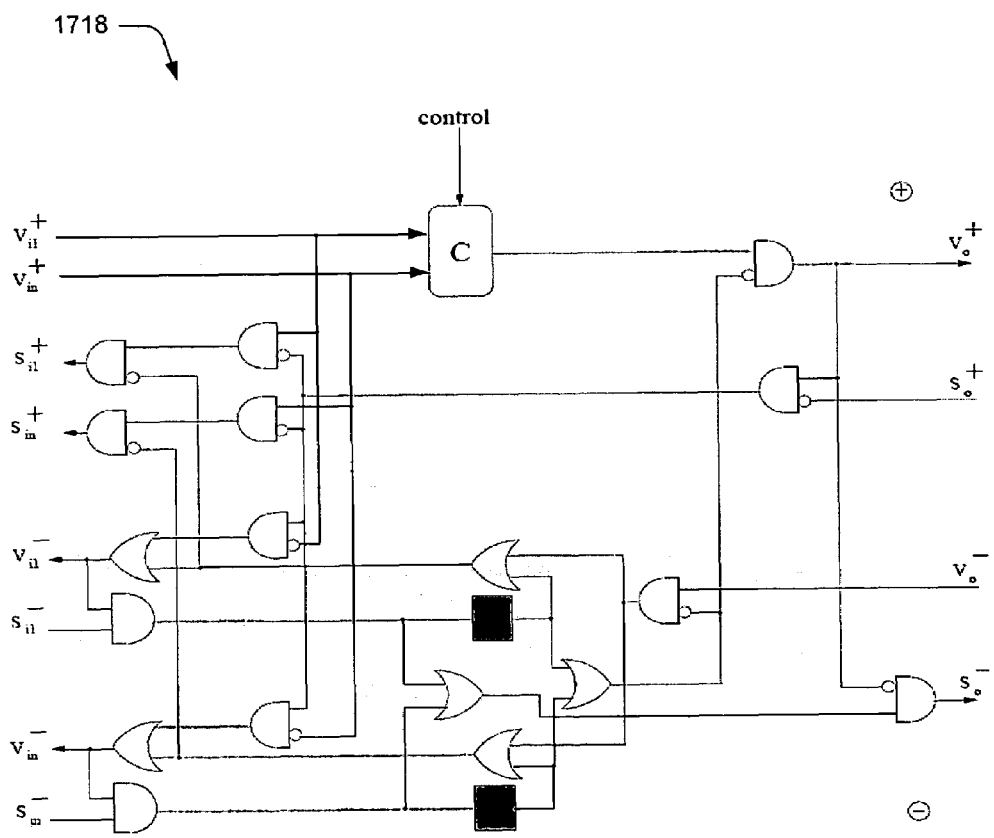
FIG. 17 depicts an exemplary design of the join from the block of FIG. 16, in accordance with an embodiment.

FIG. 17 depicts an exemplary structure 1718 of the join of FIG. 16. This instance illustrates a merge or early enabling join with negative token generation capabilities, as described above. In some implementations, the VS blocks of structure 1718 may correspond to a pair of cross-coupled latches with two gates, such as an AND and an OR gate. These gates may correspond to the gates shown in the elastic half-buffer implementation of FIG. 8.

The block C of structure 1718 may implement an enabling condition, which, when enabled, may be positive unate with respect to the valid signals. In this implementation, enabling would not be triggered by an invalid signal, as such a design may be latency sensitive. In this instance, the block C may listen to a control signal from a datapath, which may, for example, comprise a signal from a multiplexer that is part of the datapath. This signal may inform the elastic control layer which of a plurality of tokens is relevant. The elastic control module may thus know for which token(s) to wait. In other words, the control signal may instruct a general controller which of multiple incoming tokens is relevant, so that the general controller may wait for the relevant token but not for irrelevant tokens.

In one basic example, the multiplexer may comprise a three input multiplexer. These inputs may comprise two data inputs, A and B, along with a "select" input that plays the role of the control signal and decides which of the two data inputs to send through the system. The select signal (i.e. "s") may comprise a binary signal, with possible states of 0 and 1. This multiplexer signal may comprise a condition labeled $C_{mux}$. The multiplexer may, for example, implement a function $z = A*s$ or $B*\text{not } s$, thus making $C_{mux} = Vs(VA*s \text{ or } VB*\text{not } s)$. Thus, a datapath may instruct an early enabling join and, hence, a general controller to wait for a certain token of information and may also instruct the general controller to only wait for this token. The general controller, such as ones with the elements depicted in FIG. 16, may thus act according to this instruction.

Of course, it is noted that while FIG. 17 depicts an early enabling join, a join without early enabling may also be used. Such a structure may be obtained by modifying structure 1718. More specifically, the general enabling condition function "C" may be replaced with an AND-gate, and four redundant gates may be removed from the logic generating signals. Such a structure may function to wait for all input tokens to arrive before processing an output token.

Figure 18:
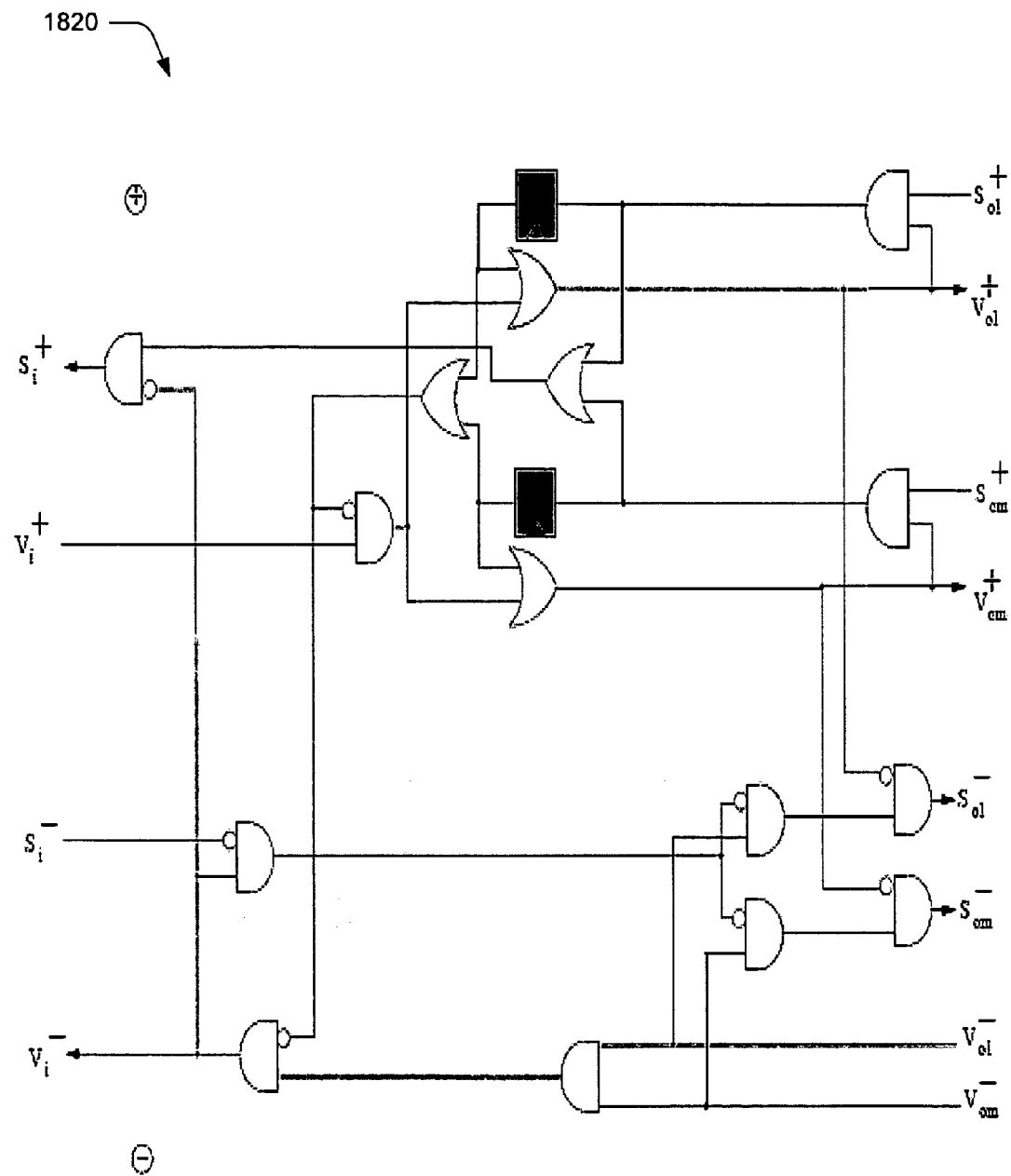
FIG. 18 depicts an exemplary design of the fork from the block of FIG. 16, in accordance with an embodiment.

FIG. 18, meanwhile, depicts an exemplary structure 1820 of the fork of FIG. 16. Here, structure 1820 may comprise an early enabling fork. In some instances, structure 1820 may be obtained by modifying the join without early enabling discussed immediately above (i.e. the join obtained from modifying the early enabling join depicted in FIG. 17). This may be accomplished by simple wire renaming and mirror reflections. Essentially, the top and bottom of the join may be switched, as may be the left and the right. Furthermore, the input wires may be renamed as output wires and the join output wires may become fork input wires.

Finally, structures of the variable latency controller and elastic buffer of FIG. 16 may be viewed with reference to FIGS. 13 and 8, respectively. It is again noted that while FIG. 8 depicts structure 800 of an elastic half-buffer. The structure of the elastic buffer from FIG. 16 may be achieved, in this implementation, by sequentially composing two structures 800 of the elastic half-buffer.

As illustrated, block 1606(*n*) may thus be configured to handle both static and variable changes in latencies of a design. It is specifically noted that block 1606(*n*) is but one non-limiting example, and that elastic blocks may be achieved at varying levels of granularity and with varying components.

Exemplary Dynamic Power Reduction

Sometimes it may be desirable to shutdown operation of a circuit or the like in order to reduce temperature or power, and so on. If, however, a clock is merely shutdown (thus shutting down a large group of blocks or the like at one time) negative effects may occur. If too many blocks are shutdown at one time, for instance, current in other parts of the circuit may experience a large spike. Furthermore, when this large group of block is "awoken", they may simultaneously draw on the circuit's power source. This may again have negative effects, such as a resulting large positive spike in current. Thus, a gradual shutdown of a system may be more desirable than a wholesale shutdown.

Implementations of the elastic flow design implementing an elastic protocol as discussed above may enable such a gradual shutdown. In some implementations, this design and corresponding protocol may be configured to shutdown a single block during a cycle, which in turn may be propagated down the system, at a rate of one pipeline stage per cycle for instance.

Figure 19:
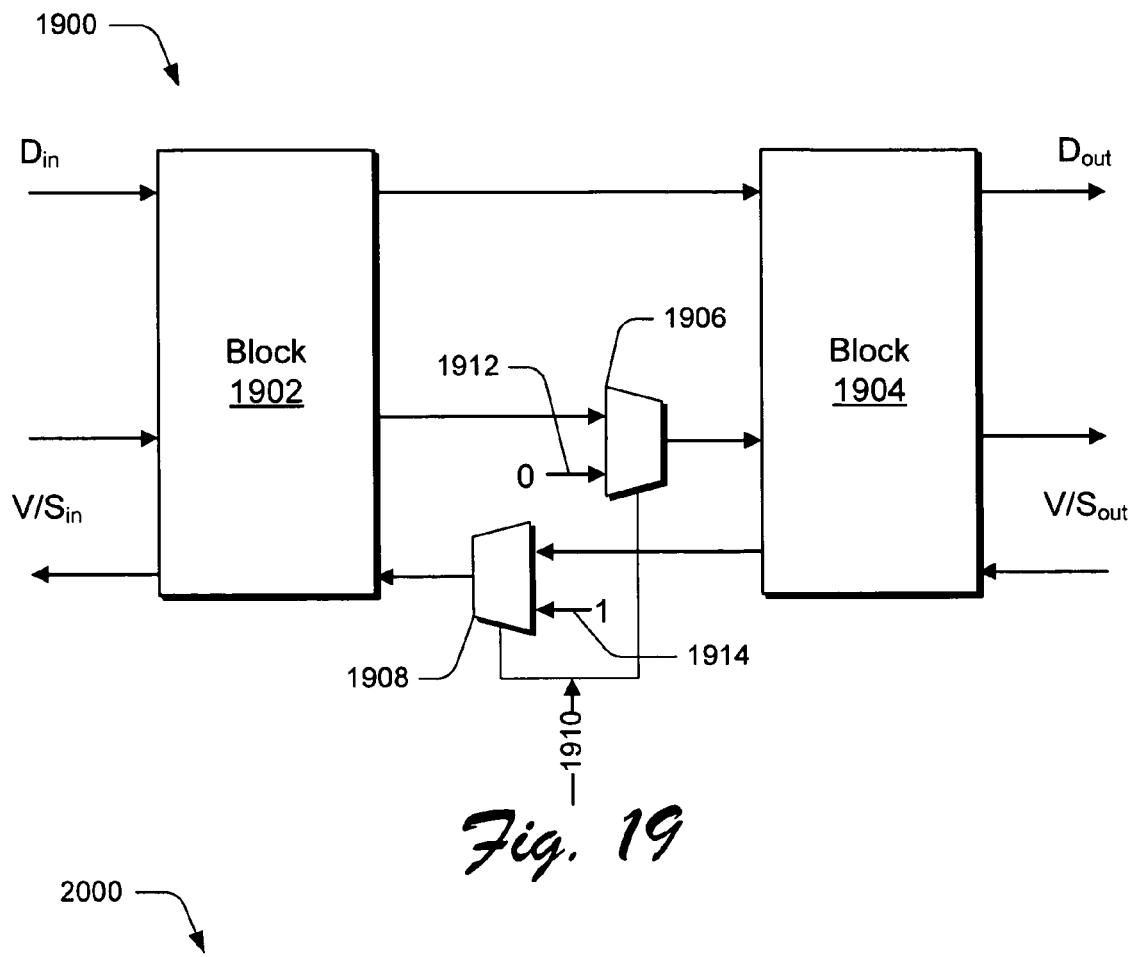
FIG. 19 depicts a dynamic power down signal applied to an elastic design in accordance with an embodiment.

FIG. 19 depicts an exemplary dynamic power reduction system 1900 including blocks 1902 and 1904. Blocks 1902 and 1904 may comprise elastic blocks, which may be grouped at any level of granularity as discussed above. For example, blocks 1902 and/or 1904 may comprise a general controller (such as one with elements depicted in FIG. 16) coupled with a datapath, or blocks 1902 and/or 1904 may comprise large or smaller sections of a design. In some implementations, system 1900 may allow for gradual shutdown of the operations of a sender and a receiver of information, such as block 1902 and block 1904, respectively.

System 1900 may further comprise multiplexers 1906 and 1908, which may serve to inject coherent stop and invalid values on an elastic channel to achieve the shutting down of operations. These stop and invalid values may be inputted on a power down signal 1910 generated from some control, possibly an external control in some implementations. For instance, signal 1910 may be initiated by one or more thermal sensors embedded in a portion of a circuit, such as a semiconductive portion of a microprocessor. These thermal sensors may sense temperature and send a shut down signal to a power control unit, which in turn may generate power down signal 1910 to be inputted into system 1900. Note that power down signal 1910 may be dynamic in some implementations.

In some implementations, multiplexer 1906 may be inserted on a valid wire between block 1902 and block 1904, which may allow for a sub-signal 1912 of signal 1910 to be inputted into block 1904 via the valid wire. In some implementations, sub-signal 1912 may be sent to block 1904 (the consumer of information in this implementation) informing the block that valid information does not exist. Again, valid information may comprise a 1 and invalid information may comprise a 0. Thus, sub-signal 1912 may be sent in the form of a 0 to block 1904 to inform the block that no valid information is being transmitted from block 1902 (the producer of information in this implementation). Thus, block 1904 may now see that there is no valid information, so block 1904 may cease providing enable signals to a datapath. The corresponding datapath may now have no information to transmit and may accordingly shut down. In sum, sub-signal 1912 may indicate to a consumer that there is no useful information coming from producer, which may cause the consumer to "go to sleep".

Furthermore, in some instances a stop signal may be sent simultaneously to block 1902, which acts as a producer of information in the illustrated implementation. This may serve to shutdown block 1902. As illustrated multiplexer 1908 may be inserted on a stop wire of system 1900. Sub-signal 1914 of signal 1910 may be sent in the form of a 1 to advise block 1902 to stop producing information. This may also serve, in some implementations, to advise block 1902 that block 1904 is no longer receiving valid signals, so that block 1902 knows to stop producing said valid signals that will not be heard or consumed. As such, block 1902 may shutdown in a gradual and consistent way, similar to block 1904.

Furthermore, one or more of blocks 1902 and 1904 may propagate these shutdown signals to forward blocks, thus shutting down a multitude of blocks in a gradual and consistent manner. Finally, note that if power down signal 1910 is turned off, then blocks 1902 and 1904 may again be coupled and may thus "awaken" and resume normal operations. Again, this may also be propagated to forward blocks, thus eventually awaking a multitude of blocks in a gradual and consistent manner. Note finally that power down signal 1910 may further be generated by any supervisory control algorithm, in some implementations. Furthermore, this signal may be randomized for security applications, thus making tracking the activity of system 1900 difficult.

Figure 20:
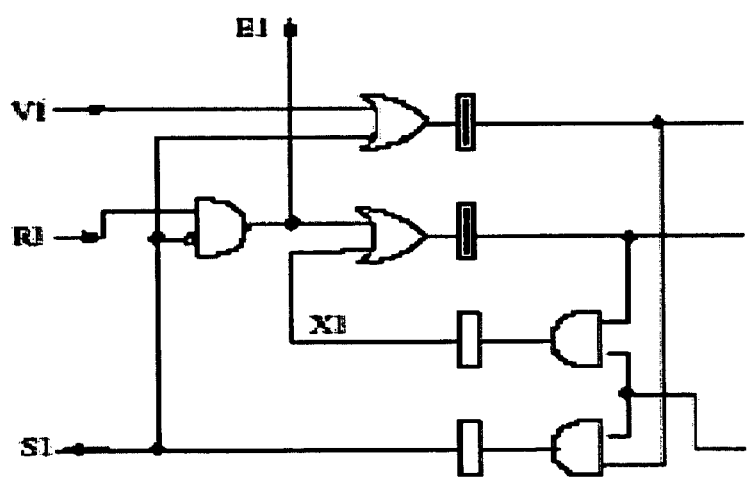
FIG. 20 depicts introduction of a "real" bit into an elastic design to reduce power, in accordance with an embodiment.

In another implementation power may also reduced by introduction of a "real" bit or the like. Reference is made to FIG. 20, which depicts a portion 2000 of a control layer having an elastic design. As illustrated, portion 2000 may include one or more valid and stop wires (depicted as V1 and S1) and portion 2000 may implement the elastic protocol described above. In this implementation, however, portion 2000 may also comprise a "real" wire, depicted here as R1. The real wire may allow for introduction of a real bit, which may allow an elastic design to differentiate between a token of information that enables datapath operation (a "real" token) and a token that is merely sent for synchronization purposes (a "fake" token). In some implementations, the former token may be designated as "real bit=1", while the latter may be designated as "real bit=0". For a fake token, the datapath may be kept disabled.

In some instances, this real bit implementation may replace negative token generation. For instance, imagine that two tokens are to be inputted into a merge point, only one of which may be relevant. In negative token generation implementations, the merge point may wait to find out which of the two is relevant and may create a negative token to squash the irrelevant token. If a real bit is used, however, then the two inputted tokens may initially be labeled as a real token and a fake token, respectively. Thus, both tokens may be allowed to travel through the system, as only the real token will actually activate the datapath. In other words, the fake token may be allowed to travel through the system along with the real token, as the fake token will not activate the datapath and will thus work no harm upon the system. Furthermore, note that this further reduction of power usage may come at the cost of a single real wire, in some implementations.

Finally, it is noted that static power reduction is also envisioned. For instance, valid bits may be configured to carry precise knowledge concerning when computation may be desired. A function that is configured to monitor valid/stop frontiers or predict future validity may be used to power gate through sleep transistors, which may reduce leakage. For instance, a block may be connected to one or more power gating transistors known as sleep transistors. An additional logic function can turn off this transistor when no valid information is delivered for a period of a few cycles (and, hence, when the block is rarely being used). When the same functions sees valid bits coming, however, they may turn the power down transistor on and wake it up. Similarly the function may also check the incoming stop and kill signals to power down the system due to anticipated long backpressure.

Exemplary Hierarchical Elasticization

Figure 21:
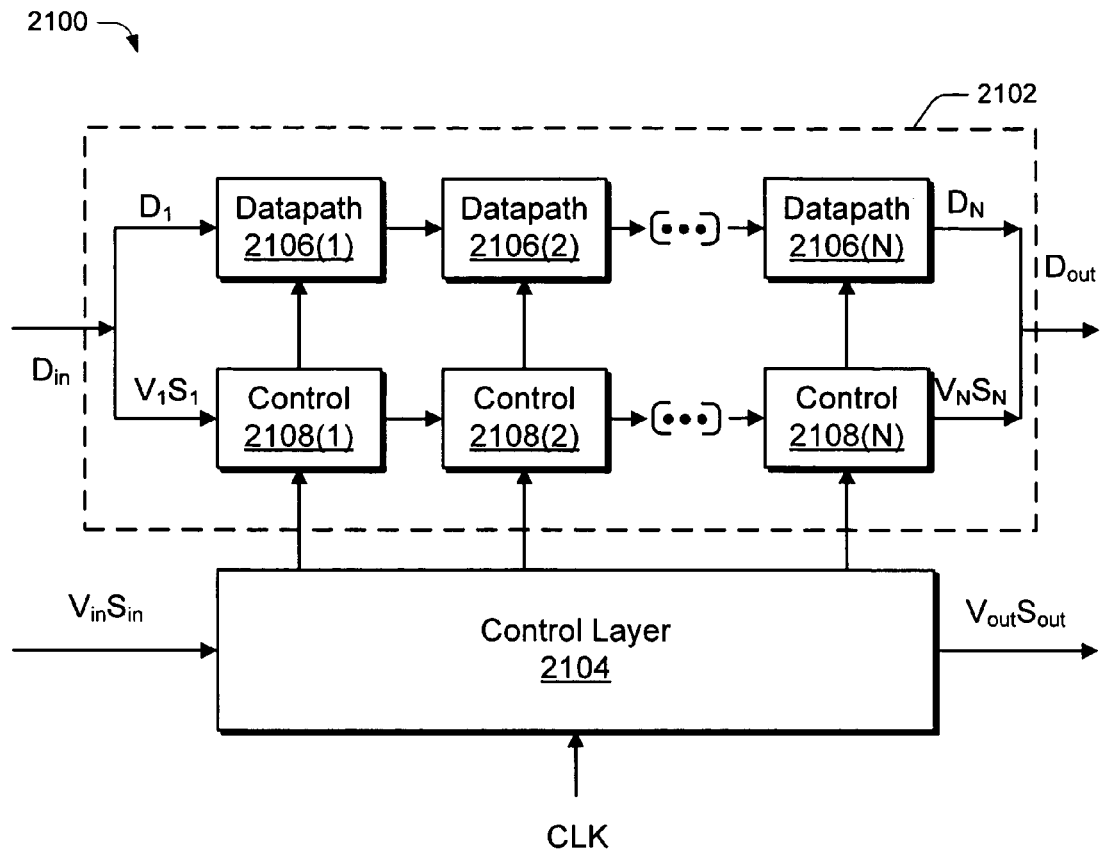
FIG. 21 depicts the design of a hierarchically elasticized circuit in accordance with an embodiment.

Not only can elasticization be applied at varying levels of granularity, but elasticization may also be applied hierarchically in some implementations. FIG. 21 depicts a hierarchically elasticized system 2100. System 2100 comprises a functional datapath 2102 as well as a control layer 2104. Again, datapaths and control layers in system 2100 may function in many of the same ways described above in regards to previous datapaths and control layers. In some instances, functional datapath 2102 may be comprised of merged components that may already retain elastic properties. For example, functional datapath 2102 may be comprised of datapaths 2106(1)-(N) as well as corresponding control layers or controls 2108(1)-(N), one or more of which may include elastic designs and may implement elastic protocols. The valid and stop signals of controls 2108(1)-(N) (illustrated as $V_1 S_1$ and $V_N S_N$) may be deemed 1-bit data items in functional datapath 2102. These signals may also be merged with the data signals of their corresponding datapaths 2106(1)-(N) (illustrated as $D_1$ and $D_N$) to form functional datapath 2102 signals $D_{in}$ and $D_{out}$. Meanwhile, control layer 2104 may comprise valid and stop signals $V_{in} S_{in}$ and $V_{out} S_{out}$. In this manner, elastic design may be applied hierarchically at multiple levels.

Exemplary Conversion of a Synchronous Design to an Elastic Synchronous Design

In the following methods, a synchronous design may be converted to a latency-tolerant or elastic design, possibly implementing the elastic protocol as discussed above. The resulting design may also be, in some instances, a control-aware or early enabling elastic design. In some implementations, a module to be designed with a synchronous design may be converted to a latency-tolerant module or elastic module. For instance, this conversion may result in a device comprising a module similar or identical to early enabling elastic modules 106 or 206 or elastic modules 208(1)-(M) or 1208(1)-(M). In any case, the resulting design may be configured to tolerate static and/or dynamic changes in the latencies of communication channels or computational units after completion of the conversion. Furthermore, the resulting design may be converted via correct-by-construction methods, so as to ensure correctness of the functional behavior of the design. In particular implementations, a large RC delay in any long wire may be reduced by inserting a sequential element. For instance, an elastic buffer may be inserted as discussed below. Again, the functional correctness of the design after this insertion may be ensured by utilization of correct-by-construction methods.

Figure 22:
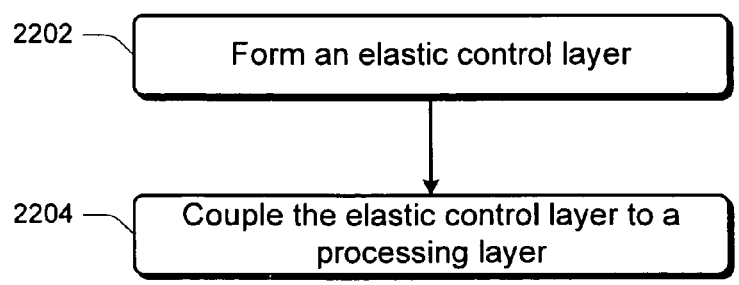
FIG. 22 is a flow diagram that illustrates acts for converting a synchronous design or module into an elastic design or module, in accordance with an embodiment.

Reference is first made to FIG. 22, which depicts a method 2200 that may be utilized to convert a design into an elastic and possibly control-aware or early enabling elastic design, in accordance with an embodiment. Method 2200 may comprise acts 2202 and 2204. Act 2202 may comprise forming an elastic control layer. This may, in some instances, comprise forming a control layer to control routing of tokens of information in an integrated circuit utilizing a synchronous design. This elastic control layer may also be configured to handle static or dynamic latencies of the tokens and may be configured to route one or more tokens of information without waiting for all input tokens of information. Act 2204 may comprise coupling the elastic control layer to a processing layer. In some implementations, a processing layer may also be termed a datapath. The processing layer or datapath may be configured to process tokens of information.

In some implementations a conversion method may further include partitioning a synchronous design into modules or blocks, which may be accomplished at either a coarse or fine grain granularity. In a latch-based design for example, the design may be partitioned into a block comprising a combinational computation following by a latch. In a flip-flop based design, meanwhile, the design may be partitioned into modules at a fine-grained level, in some implementations. Each of these modules may contain combinational logic as well as a flip-flop register, which may follow the combinational logic. In other words, a fine grain partition may be accomplished using existing pipe stages, for example. Furthermore, even finer partitions may exist. For example, modules may comprise a single gate of an original design. In some instances, however, modules may be partitioned at a coarser grain. In one implementation, for instance, modules may comprise multiple pipeline stages that may be controlled with a single controller.

In some instances, a method of converting a synchronous design into a elastic design may also comprise selecting a controller for each module or block. One or more of these controllers may comprise elastic controllers in some implementations. In a latch-based pipeline stage, for example, a general controller with the elements shown in FIG. 16 may be selected. Here, the number of inputs and outputs may equal the number of preceding and succeeding blocks in the original synchronous design. In some instances, one or more of the selected controllers may be coupled so as to form a control layer, which may be an elastic control layer.

Furthermore, a conversion method may also include replacing flip-flop registers in the original synchronous design with latches, which may be pairs of back-to-back latches that may have independent clock pins. For latch-based registers, meanwhile, no changes may be needed. Some conversion method implementations may also comprise selecting enabling functions that are consistent with the merging of information flows in the processing layer or datapath. As described in the above-text and referenced figures, these functions may comprise a C function. In some implementations the processing layer or datapath may include a multiplexer. Sometimes, this multiplexer may compute a function $z=A^*s$ or $B^*$not s. In these instances an exemplary enabling function may be $Cz=Vs$ and $(VA^*s$ and $VB^*$not s).

In some instances, a method may also comprise coupling the elastic layer controller with the portion of the processing layer or datapath corresponding to the original design. This may including using enable signals, such as $En^+$ and $En^-$, to gate clock driving latches in the processing layer or datapath. Furthermore, in some instances select signals from the datapath may be coupled to the corresponding control inputs of the enabling functions (e.g. C functions). For example, a select signal of a multiplexer may be coupled to the select signals of the enabling function (e.g. the C functions shown in FIG. 17).

Additionally, in some conversion implementations one or more elastic buffers or elastic half-buffers may be inserted on long wires. In some instances, these elastic buffers or half-buffers may be empty, as discussed above. Furthermore, these insertions may serve to modify or vary the latency of computations or communications in the processing layer or datapath. In some instances, these insertions may serve to create a static latency change that may be adequately handled by the control layer implementing an elastic protocol, as discussed above.

Furthermore, variable latency controllers, functions, and/ or units may also be inserted into the design. These insertions may also serve to modify or vary the latency of computations or communications in the processing layer or datapath. In some instances, these insertions may serve to create a variable or dynamic latency change that may be adequately handled by the control layer implementing an elastic protocol, as discussed above. In addition, each variable latency function may be provided with an interface to allow for communication between the variable latency function in the control layer and the processing layer or datapath. For instance, the interface depicted in FIG. 13 may be provided. This interface may provide a request signal "req" to start computation, a completion signal "done", and an acknowledge signal "ack" to report to the processing layer that the elastic layer consumed the computed token. Finally, in some implementations these variable latency interfaces may be coupled with the corresponding interfaces of the general controller(s).

After conversion, the resulting design may be elastic and may also be a functional or flow equivalent to the original synchronous design. In other words, the design may be able to adequately handle changes in static and/or dynamic latencies while still computing and communicating properly. Although some of the above conversion implementations have been illustrated by transforming the original design based on pipe-stage partitioning, it is possible to translate at a coarse grain by controlling a block with multiple latches and flip-flops using a single controller. This block-level controller, however, may be slightly modified for the black-box blocks by providing, for instance, interface latches at the inputs and/or outputs of the block so as to keep the stalled values in case of backpressure.

Exemplary System

Figure 23:
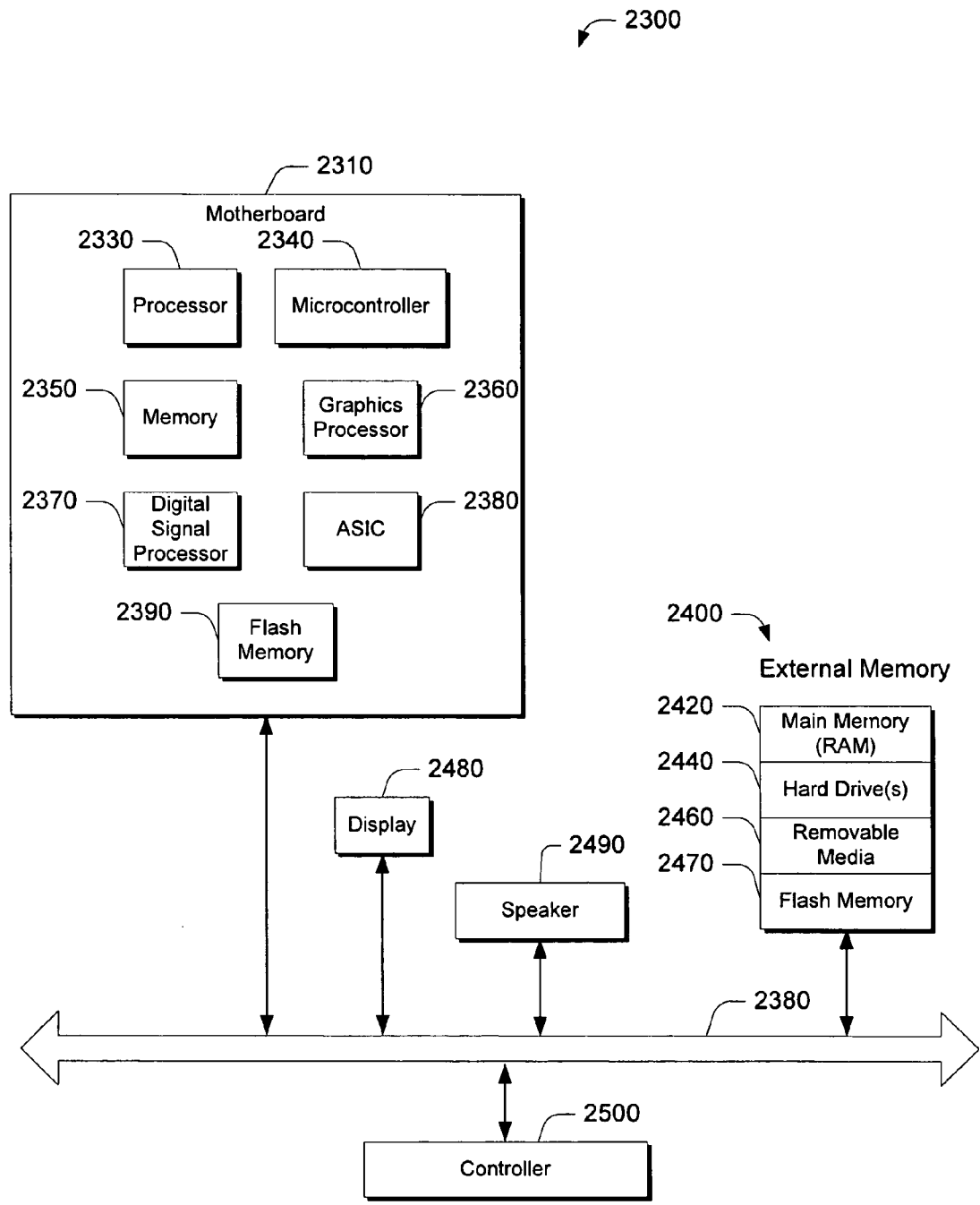
FIG. 23 is a diagram that illustrates an exemplary system in which integrated circuits utilizing elastic designs in accordance with the embodiments described herein can be used, in accordance with an embodiment.

Referring to FIG. 23, a block diagram of an exemplary electronic system that can include latency-tolerant or elastic designs or modules, such as those described above is shown generally at 2300. Such electronic system can comprise a computer system that includes a motherboard 2310 which is electrically coupled to various components in electronic system 2300 via a system bus 2320. System bus 2320 may be a single bus or any combination of buses.

Motherboard 2310 may include, among other components, one or more processors 2330, a microcontroller 2340, memory 2350, a graphics processor 2360 or a digital signal processor 2370, and/or a custom circuit or an application-specific integrated circuit 2380, such as a communications circuit for use in wireless devices such as cellular telephones, pagers, portable computers, two-way radios, and similar electronic systems and a flash memory device 2390. One or more processors 2330 may also comprise one or more integrated circuits.

Electronic system 2300 may also include an external memory 2400 that in turn may include one or more memory elements suitable to the particular application, such as a main memory 2420 in the form of random access memory (RAM), one or more hard drives 2440, and/or one or more drives that handle removable media 2460, such as floppy diskettes, compact disks (CDs) and digital video disks (DVDs). In addition, such external memory may also include a flash memory device 2470.

Electronic system 2300 may also include a display device 2480, a speaker 2490, and a controller 2500, such as a keyboard, mouse, trackball, game controller, microphone, voice-recognition device, or any other device that inputs information into electronic system 2300.

Conclusion

Although the embodiments have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. An integrated circuit comprising:
one or more components operable to:
receive a plurality of tokens;
receive an input referencing a portion of the plurality of tokens, wherein the portion does not reference at least one said token; and
process the referenced portion of the plurality of tokens to produce an output, wherein the processing is initiated before receipt of the at least one said token;
wherein the one or more components employ a synchronous design;
wherein the integrated circuit comprises an early enabling elastic module comprising a variable latency unit; and
wherein the synchronous design employs the variable latency unit configured to output tokens at a variable number of clock cycles.

2. An integrated circuit as described in claim 1, wherein the synchronous design employs one or more elastic buffers to store at least two said tokens of information sent at different times.

3. An integrated circuit as described in claim 2, wherein the one or more elastic buffers comprise a first sub-channel to propagate tokens of information in a first direction and a second sub-channel to propagate squash requests in a second direction, the second direction being approximately opposite to the first direction.

4. An integrated circuit as described in claim 1, wherein the one or more components are further operable to create one or more negative tokens comprising squash requests to squash the at least one said token that was not referenced.

5. An integrated circuit as described in claim 4, wherein the one or more components are further operable to store said negative tokens comprising squash requests such that the at least one said token that was not referenced may be squashed upon arrival at the one or more components.

6. An integrated circuit as described in claim 4, wherein the one or more components are further operable to send one or more said negative tokens comprising squash requests towards the at least one said token that was not referenced, such that the at least one said token may be squashed when it collides with the at least one negative token.

7. An integrated circuit comprising:
one or more components employing a synchronous design and operable to receive one or more tokens of information, wherein at least one of said components comprises a variable latency unit to perform operations on said tokens and configured to output tokens of information at a variable number of clock cycles without waiting for at least one token of information comprising irrelevant information.

8. An integrated circuit as described in claim 7, wherein the one or more components are further operable to create negative tokens comprising squash requests to squash the at least one token of information comprising irrelevant information.

9. An integrated circuit as described in claim 7, wherein the one or more components comprise a datapath coupled to a control layer, the datapath configured to send a select signal to inform the control layer which of said received tokens of information comprise relevant information or which of said received tokens of information comprise irrelevant information.

10. An integrated circuit as described in claim 9, wherein the variable latency unit further comprises a variable latency controller configured to receive the select signal and administer output of a token of information without waiting for the at least one token of information comprising irrelevant information.

11. An integrated circuit as described in claim 7, wherein at least one of the one or more components comprises an early enabling join configured to receive a plurality of tokens of information and output a token of information before receiving each of said plurality of tokens.

12. An integrated circuit as described in claim 7, wherein at least one of the one or more components comprises an eager fork configured to receive a token of information and output one or more tokens of information to a plurality of destinations, wherein the eager fork is further configured to output said one or more tokens to one of said plurality of destinations when said one destination is ready to receive information and without regard to whether the remaining destinations of said plurality of destinations are ready to receive information.

13. An integrated circuit as described in claim 7, further comprising an elastic buffer configured to retain at least two tokens of information generated at different times.

14. An integrated circuit as described in claim 7, wherein the one or more components further comprise:
a merge or an early enabling join to receive a plurality of said received tokens of information and configured to output tokens before receiving all of said plurality of received tokens;
an elastic buffer; and
an eager fork to output one or more of said received tokens to a plurality of receivers and configured to output tokens before all of the receivers are ready to receive tokens.

15. A method comprising:
forming, in a computing device, an elastic control layer to control routing of tokens of information in an integrated circuit utilizing a synchronous design, the elastic control layer configured to handle static or dynamic latencies of the tokens and configured to route one or more tokens of information without waiting for at least one said token of information that is designated as irrelevant; and
coupling the elastic control layer to a processing layer, the processing layer to process said tokens of information.

16. A method as described in claim 15, wherein said irrelevant token of information is designated by the elastic control layer receiving a select signal designating a portion of said tokens of information as relevant.

17. A method as described in claim 15, wherein the forming comprises replacing flip-flop registers in an original synchronous design with pairs of back-to-back latches.

18. A method as described in claim 15, wherein the forming comprises selecting one or more enabling functions that are consistent with merging of information flows in an original synchronous design.

19. A method as described in claim 15, wherein the forming comprises coupling one or more variable latency interfaces with corresponding general controller interfaces.

20. A method as described in claim 15, wherein the forming comprises inserting one or more empty elastic half buffers or elastic buffers into the processing layer.

21. A method as described in claim 20, wherein the inserting of the one or more empty elastic half buffers or elastic buffers modifies a static latency of a computation in the processing layer.

22. A method as described in claim 15, wherein the forming comprises coupling one or more controllers, at least one of the one or more controllers being an elastic controller.

23. A method as described in claim 22, wherein the coupling of the elastic control layer to the processing layer comprises coupling the at least one elastic controller with a corresponding portion of the processing layer.

24. A method as described in claim 23, wherein the coupling of the elastic controller comprises using enable signals to gate one or more clock driving latches in the processing layer.

25. An electronic system comprising:
a processor configured to perform one or more operations and including an elastic module to address changes in static or dynamic latencies of a communication channel or computational unit in a synchronous design, the elastic module configured to produce an output token without waiting for irrelevant information; and
a controller configured to provide input commands to perform at least one of the one or more operations.

26. An electronic system as described in claim 25, wherein the elastic module is configured to implement an elastic protocol to:
propagate valid tokens of information in a forward direction; and
request to squash tokens in a backward direction relative to the forward direction to squash irrelevant information.

27. An electronic system as described in claim 25, wherein the elastic module further comprises one or more elastic buffers to insert into one or more elastic channels to allow for changes in static latencies.

28. An electronic system as described in claim 25, wherein the elastic module further comprises a producer of information and a consumer of information, the producer of information configured to receive a signal from an external controller directing the producer of information to stop sending information, and the consumer of information configured to receive a signal from the external controller advising the consumer of information that no valid data is being transmitted from the producer of information.

* * * * *